United States Patent
Parks et al.

(10) Patent No.: US 9,847,159 B2
(45) Date of Patent: Dec. 19, 2017

(54) PULSED ACTIVATION OF TRAPPED FIELD MAGNETS

(71) Applicant: NATIONAL OILWELL VARCO, L.P., Houston, TX (US)

(72) Inventors: Drew Paul Parks, Houston, TX (US); Roy Weinstein, Houston, TX (US)

(73) Assignee: NATIONAL OILWELL VARCO, L.P., Houston, TX (US)

(*) Notice: Subject to any disclaimer, the term of this patent is extended or adjusted under 35 U.S.C. 154(b) by 61 days.

(21) Appl. No.: 14/432,705

(22) PCT Filed: Oct. 7, 2013

(86) PCT No.: PCT/US2013/063710
§ 371 (c)(1),
(2) Date: Mar. 31, 2015

(87) PCT Pub. No.: WO2014/058790
PCT Pub. Date: Apr. 17, 2014

(65) Prior Publication Data
US 2015/0294776 A1    Oct. 15, 2015

Related U.S. Application Data

(60) Provisional application No. 61/710,847, filed on Oct. 8, 2012, provisional application No. 61/824,903, filed on May 17, 2013.

(51) Int. Cl.
*H01F 6/00*   (2006.01)
*H01F 41/00*  (2006.01)
(Continued)

(52) U.S. Cl.
CPC ............. *H01F 6/008* (2013.01); *H01F 6/00* (2013.01); *H01F 41/00* (2013.01); *H01L 39/126* (2013.01); *H01L 39/2419* (2013.01)

(58) Field of Classification Search
CPC . H01F 6/00; H01F 6/008; H01F 41/00; H01L 39/2419; H01L 39/126
See application file for complete search history.

(56) References Cited

U.S. PATENT DOCUMENTS

| | | |
|---|---|---|
| 3,940,643 A | 2/1976 | Sika et al. |
| 5,306,701 A | 4/1994 | Israelsson et al. |

(Continued)

FOREIGN PATENT DOCUMENTS

WO    2014058790 A1    4/2014

OTHER PUBLICATIONS

International Search Report for related International Application No. PCT/US15/12232, dated Mar. 29, 2016.

(Continued)

*Primary Examiner* — Bernard Rojas
(74) *Attorney, Agent, or Firm* — Jones Robb, PLLC

(57) ABSTRACT

A system for activating trapped field magnets in a superconducting material is disclosed. The system includes a superconducting material element and an electromagnet source disposed proximate the superconducting material element. The electromagnet source is configured to produce a magnetic field pulse sufficient to activate the superconducting material element. Furthermore, substantially all of a magnetic field generated by the magnetic field pulse is contained within an area that has smaller physical lateral dimensions than the superconducting material element.

20 Claims, 24 Drawing Sheets

(51) Int. Cl.
H01L 39/12 (2006.01)
H01L 39/24 (2006.01)

(56) References Cited

U.S. PATENT DOCUMENTS

| | | | | |
|---|---|---|---|---|
| 5,659,278 | A * | 8/1997 | Yanagi | H01F 6/008 335/216 |
| 6,083,885 | A | 7/2000 | Weinstein | |
| 6,335,623 | B1 * | 1/2002 | Damadian | A61B 5/055 324/319 |
| 6,525,002 | B1 | 2/2003 | Weinstein | |
| 6,621,395 | B1 * | 9/2003 | Bromberg | H01F 6/008 335/216 |
| 7,026,901 | B2 | 4/2006 | Yanagi et al. | |
| 7,498,915 | B1 * | 3/2009 | Leupold | H01F 6/00 335/216 |
| 7,667,562 | B1 | 2/2010 | Weinstein | |
| 2001/0013818 | A1 | 8/2001 | Young | |
| 2006/0166832 | A1 * | 7/2006 | Sugimoto | H01F 6/00 505/100 |
| 2016/0336102 | A1 | 11/2016 | Parks et al. | |

OTHER PUBLICATIONS

Written Opinion for related International Application No. PCT/US15/12232, dated Mar. 29, 2016.
Roy Weinstein, Drew Parks, Ravi-Persad Sawh, and Kent Davey, "Characteristics of trapped field magnet activation by flux pumping." IEEE Trans. Appl. Supercond., vol. 21, No. 3, part II, pp. 2436-2440, Jun. 2011.
Drew Parks, Roy Weinstein, Kent Davey, Ravi-Persad Sawh, and Bill Mayes, "The effect of a ferromagnetic medium on the field of YBCO trapped field magnets," IEEE Trans. Appl. Supercond., vol. 19, No. 3, pp. 2937-2940, 2009.
M. Sander, U. Sutter, M. Adam and M. Klaeser, "Comparison of pulsed magnetization process for HTS bulk parts," Supercond. Sci. Technol., vol. 15, pp. 748-753, 2002.
R. Liang, P. Dosanjh, D. A. Bonn, and W. Hardy, "Lower critical fields in an ellipsoid-shaped YBa2Cu3O6.95 single crystal," Phys Rev. B, vol. 50, pp. 4212-4215, 1994.
S. Braeck, D. Shantsev, T. Johansen and Y. Galperin, "Superconducting trapped field magnets: temperature and field distributions during pulsed field activation," Jour. Appl. Phys., vol. 92, pp. 6235-6240, 2002.
D. Parks, R. Weinstein, K. Davey, and R. Sawh, "A study of pulsed activation of trapped field magnets—Part 1: effects of pulse height and creep," IEEE Trans. Appl. Supercond. 23 6800205, 2013.
R. Weinstein et al., "Properties of HTS for successful U/n processing," Physica C 341-348, pp. 1415-1418, 2000.
R. Weinstein, "An overview of U/n processing," Advances in Superconductivity XII ed T, Yamashita and K Tanabe (Tokyo: Springer-Verlag), pp. 521-526, 2000.
M. Strasik, J. R. Hull, J. A. Mittleider, J. F. Gonder, P. E. Johnson, K. E. McCrary and C. R. McIver, 2010, An overview of Boeing flywheel energy storage systems with high-temperature superconducting bearings, Supercond. Sci. Technol., 23 034021, 2010.
M. Miki et al., "Development of a synchronous motor with GdBCO bulk superconductors as pole field magnets for propulsion system," Supercond. Sci. Technol. 19 S494, 2006.
X. Feng, G. Gao, K. Davey, M. Werst, R. Hebner, R. Weinstein, D. Parks and R. Sawh, "Radial flux high temperature superconductor motor using bulk trapped field magnets," IEEE Int. Electric Machines & Drives Conf., Miami, FL May 2009, pp. 458-464.
B. Oswald, M. Krone, M. Soll, T. Strasser, J. Oswald, K. Best, W. Gawalek and L. Kovalev, "Superconducting reluctance motors with YBCO bulk material," IEEE Transactions in Applied Superconductivity, vol. 9, pp. 1201-1204, Jun. 1999.
R. Weinstein, D. Parks, R. Sawh and K. Davey, "Measurements of flux pumping activation of trapped field magnets Supercond.," Sci. Technol., 23 115015, 2010.
K. Davey, R. Weinstein, D. Parks, and R. Sawh, "Activation of trapped field magnets by flux pumping," IEEE Transactions on Magnetics, 47 pp. 1090-1093, 2011.
K. Davey, R. Weinstein, D. Parks and R. Sawh, "Simulating the trapped B field in bulk superconductors using a mutual inductance coupling technique," IEEE Trans. Magn., 49 pp. 1153-1158, 2013.
Z. Xu, R. R Lewin, A. M. Campbell, D. A. Cardwell and H. Jones, "Simulation studies on the magnetization of (RE)BCO bulk superconductors using various split coil arrangements," Supercond. Sci. Technol., 25 025016, 2012.
Z. Deng, M. Miki, B. Felder, K. Tsuzuki, N. Shinohara, R. Taguchi, K. Suzuki and M. Izumi, "The effectiveness of pulsed-field magnetization with respect to different performance bulk superconductors." J. Supercond. Nov. Magn., 25 pp. 61-66, 2012.
R. Das, Z. Islam, J. Ruff, R. Sawh, R. Weinstein, J. Kim, P. Canfield and J. Lang, "A novel approach for x-ray scattering experiments in magnetic fields utilizing trapped flux in type-II superconductors," Rev. Sci. Instrum., 83 065103, 2012.
J. Zou, M. Ainslie, D. Hu, D. Cardwell, "Influence of Time-Varying External Magnetic Fields on Trapped Fields in Bulk Superconductors," EEE Transactions in Applied Superconductivity, vol. 25, No. 3, Jun. 2015.
D. Yazici, M. Erdem, B. Ozcelik, "Improvement of the Intergranular Pinnning Energy in the (BiPb)2Sr2Ca2Cu2O10+δ Superconductors Doped with High Valancy Cations," J. Supercond. Nov. Magn., 25 pp. 725-729, 2012.
International Search Report for corresponding International Patent Application No. PCT/US2013/63710, dated Feb. 28, 2014.
Written Opinion for corresponding International Patent Application No. PCT/US2013/63710, dated Feb. 28, 2014.
International Patent Application No. PCT/US2015/12232, entitled "Systems and Methods for Activation of Trapped Field Magnets," filed Jan. 21, 2015.
C.P. Bean, "Magnetization of High-Field Superconductors," Rev. Mod. Phys. 36, pp. 31-39 (1964).
Y. Kimura, H. Matsuzaki, I. Ohtani, E. Morita, M. Izumi, N. Sakai, J. Hirabayashi, M. Miki, M. Kitano, T. Ida, Supercond. Sci. Technol. 19, 5466, 2006.
R. P. Sawh, Yanru Ren, Roy Weinstein, Wolfgang Hennig and Takayuki Nemoto, "Uranium Chemistry and Pinning Centers in HTS," Physica C 305, 159,1998.
Roy Weinstein, Ravi Sawh, Yanru Ren, Michael Eisterer, Harald W. Weber, "The role of uranium chemistry and uranium fission in obtaining ultra-high Jc in textured Y123." Supercond. Sci. Technol. 11, 959, 1998.
D. R. Nelson, "Vortex entanglement in high-Tc superconductors," Phys. Rev. Lett. 60, 1973,1988.
Y. Ren, R. Weinstein, J. Liu, and R. P. Sawh, C. Foster, "Damage Caused by Magnetic Pressure at High Trapped Field in Quasi-Permanent Magnets Composed of Melt-Textured YBaCuO Superconductor," Physica C 251, 15,1995.
Roy Weinstein, Alberto Gandini, Ravi-Persad Sawh, Bill Mayes, and Drew Parks, "Experimental test of the postulate that continuous columnar pinning centers produce the highest Jc," Phys. Lett. A 331, pp. 276-280, 2004.
Roy Weinstein, Drew Parks, Ravi-Persad Sawh, Kent Davey and Keith Carpenter "A study of pulsed activation of trapped field magnets—Part II: effects of multiple pulsing." Supercond. Sci. Technol. 26, 095005, 2013.
R.-P. Sawh, R. Weinstein, D. Parks, A. Gandini, Y. Ren, and I. Rusakova, "Tungsten and Molybdenum Double Perovskites as Pinning Centers in Melt-Textured Y123," Physica C, vol. 383/4, pp. 411-416, Jan. 2003.
Roy Weinstein, Ravi-Persad Sawh, Drew Parks, Bill Mayes, "Improvement of high Tc superconductor by near-optimum pinning centers created by high Z, high-energy ions." Nuclear Instruments and Methods in Physics Research B, vol. 272 pp. 284-290, Jan. 2012.
R. Weinstein, D. Parks, R.-P. Sawh, B. Mayes, A. Gandini, A. Goyal, Y. Chen, V. Selvamanickam, "Effects on Jc of pinning center

(56) References Cited

OTHER PUBLICATIONS morphology for multiple-in-line-damage in coated conductor and bulk, melt-textured HTS." Invited journal paper, Physica C 469, pp. 2068-2076, Dec. 2009.

E Morita, H Matsuzaki, Y Kimura, I Ohtani, H Ogata, M Izumi, Y Nonaka, M Murakami, T Ida, H Sugimoto, M Miki and M Kitano, "Study of single pulsed-field magnetization of Gd—Ba—Cu—O bulk high-temperature superconductor with a split type of armature coil for rotating machinery," Supercond. Sci. Technol. 19, pp. S486-S490, 2006.

Hiroyuki Fujishiro, Tomoyuki Naito, and Mitsuru Oyama, "Mechanism of magnetic flux trapping on superconducting bulk magnetized by pulsed field using a vortex-type coil," Supercond. Sci. Technol. 24, 075015, 2011.

E Morita, H Matsuzaki, Y Kimura, H Ogata, M Izumi, T Ida, M Murakami, H Sugimoto, and M Miki, "Study of a new split-type magnetizing coil and pulsed field magnetization of Gd—Ba—Cu—O high temperature superconducting bulk for rotating machinery application," Supercond. Sci. Technol. 19, pp. 1259-1263, 2006.

K Yamaguchi et al., "Pulsed Field Magnetization Properties for a Large Single-grain Gd—Ba—Cu—O High-Temperature Superconductor Bulk with a Diameter of 140 mm by using a New Type of Pulsed Copper Split Coil," Journal of Physics: Conference Series, 97, 012278, 2008.

Extended European Search Report for corresponding European Application No. 13845380.8, dated May 3, 2016.

Non-Final Office Action dated Jan. 18, 2017 from co-pending U.S. Appl. No. 15/112,883.

Final Office Action dated Jul. 12, 2017 from co-pending U.S. Appl. No. 15/112,883.

\* cited by examiner

PULSED ACTIVATION OF TRAPPED FIELD MAGNETS

CROSS-REFERENCE TO RELATED APPLICATIONS

This is a national stage application of PCT/US2013/063710, filed internationally on Oct. 7, 2013, which claims priority to U.S. Provisional Patent Application No. 61/710,847, filed Oct. 8, 2012 and entitled "Systems and Methods for Pulsed Activation of Trapped Field Magnets;" and U.S. Provisional Patent Application No. 61/824,903, filed May 17, 2013, entitled "Systems and Methods for Pulsed Activation of Trapped Field Magnets," each of which is incorporated by reference herein in its entirety.

TECHNICAL FIELD

The present disclosure relates generally to the activation of superconducting trapped field magnets, and related methods and systems.

INTRODUCTION

The section headings used herein are for organizational purposes only and are not to be construed as limiting the subject matter described in any way.

Magnets have numerous applications, including, for example, the ability to transfer electric energy into mechanical energy without much energy loss. Magnets are, therefore, an important component in various technologies, including, for example, electric motors and generators. Permanent magnets (i.e., ferromagnetic materials that create their own persistent magnetic fields), however, can be significantly limited in the magnitude of magnetic field which they can supply. Additionally, permanent magnets are composed of materials which are relatively rare and sometimes found in only limited geographical areas around the world. Accordingly, permanent magnets are expensive and sometimes cost prohibitive for use in various applications.

Furthermore, conventional permanent magnet motors and generators have power constraints, in which the amount of power that can be delivered is limited by the size and weight of the motor/generator which leads to constraints on size and/or weight design parameters that can be unduly limiting. In general, shrinking the size of permanent magnets results in a decrease in power output due to the magnetic field strength decreasing. Power per unit volume (i.e., power density), therefore, can be severely limited when ordinary permanent magnets are used in motors. Accordingly, there is a need for alternative materials with the potential to produce persistent magnetic fields that are less expensive (i.e., contain less rare material) and are stronger (i.e., have larger field magnitudes).

It has been discovered that a significant magnetic field can be "trapped" by a superconductor when it exhibits large flux pinning forces, which may result in a quasi-permanent magnetic material. In other words, when a superconducting material is placed in a very high magnetic field, the material may be activated to replicate the magnetic field, thereby producing its own persistent magnetic field. In particular, high temperature superconductors (HTSs) can be activated to form trapped field magnets (TFMs), and the resulting magnetic fields have been determined to be stronger than their permanent magnet counterparts.

Although research has increased the understanding of HTSs and TFMs, improved TFM activation techniques can lead to greater, more reliable applications. For example, current TFM activation generally has the following limitations: 1) the TFMs need to be placed in a very high magnetic field that is, for example, generated by a very large, expensive, and heavy magnet (e.g., permanent magnet or electromagnet); and 2) the TFMs need to remain very cold during the activation and operation to hold the trapped magnetic field.

It may therefore be desirable to provide systems and methods for TFM activation that not only provide practical and efficient TFM activation, but also provide robust TFMs that are fully activated. It may also be desirable to provide systems and methods for TFM activation that rely on reduced electrical energy and heating.

SUMMARY

The present disclosure may solve one or more of the above-mentioned problems and/or achieve one or more of the above-mentioned desirable features. Other features and/or advantages may become apparent from the description which follows.

In accordance with an exemplary embodiment of the present disclosure, a system for activating trapped field magnets includes a superconducting material element and an electromagnet source disposed proximate the superconducting material element. The electromagnet source is configured to produce a magnetic field pulse sufficient to activate the superconducting material element. Furthermore, substantially all of a magnetic field generated by the magnetic field pulse is contained within an area that has smaller physical lateral dimensions than the superconducting material element.

In accordance with an additional exemplary embodiment of the present disclosure, a method for activating a trapped magnetic field in a superconducting material includes generating at least one magnetic field pulse proximate a superconducting material element. Substantially all of a magnetic field generated by the at least one magnetic field pulse is contained within an area that has smaller physical lateral dimensions than the superconducting material element. Furthermore, the at least one magnetic field pulse is sufficient to at least partially activate a trapped magnetic field in the superconducting material element.

Additional objects and advantages will be set forth in part in the description which follows, and in part will be obvious from the description, or may be learned by practice of the present teachings. At least some of the objects and advantages of the present disclosure may be realized and attained by means of the elements and combinations particularly pointed out in the appended claims.

It is to be understood that both the foregoing general description and the following detailed description are exemplary and explanatory only and are not restrictive of the present disclosure and claims, including equivalents. It should be understood that the present disclosure and claims, in their broadest sense, could be practiced without having one or more features of these exemplary aspects and embodiments.

BRIEF DESCRIPTION OF DRAWINGS

The accompanying drawings, which are incorporated in and constitute a part of this specification, illustrate some exemplary embodiments of the present disclosure and together with the description, serve to explain certain principles. In the drawings.

DESCRIPTION OF EXEMPLARY EMBODIMENTS

Reference will now be made in detail to various exemplary embodiments of the present disclosure, examples of which are illustrated in the accompanying drawings. Wherever possible, the same reference numbers will be used throughout the drawings to refer to the same or like parts.

Trapped field magnets (TFMs) have great potential to replace conventional permanent magnets in numerous applications, and when operated at substantially low temperatures, exhibit stronger magnetic fields than their permanent magnet counterparts. By way of example, a TFM motor can deliver the same amount of power as a conventional permanent magnet motor but with a significant reduction in size and weight. Although research has increased the understanding of TFMs, a need remains for improved TFM activation techniques, which do not require, for example, exposing superconducting materials (i.e., superconductors) to very large, constant magnetic fields, generated, for example, by an expensive, large, and heavy magnet (i.e., permanent magnet or electromagnet). Such conventional activation techniques that use, for example, high field electromagnets, are impractical for activating and/or reactivating (e.g., when the TFM loses its magnetic field) a TFM residing within an application in use in a place other than a laboratory. That is in various applications it may be desirable to enable activation or reactivation onsite, or in situ, and it may be impractical to do so if reliance is on, for example, a large, heavy electromagnet.

An alternative to activation using very large constant magnetic fields is pulsed magnetic field activation, which can activate a TFM using electromagnets that are much smaller and lighter. However, magnetic field pulses, for example, may also generate heat that warms up the TFMs, making them lose all or part of their "trapped" field. Thus, a need remains for improved activation techniques, including pulsed activation techniques, for TFMs that not only provide practical and efficient TFM activation, but also provide TFMs that are fully activated. It may be desirable, therefore, to provide systems and methods for TFM activation which use very short magnetic field pulses, which require less electrical energy and therefore smaller energy supplies, resulting in less heating of the TFM.

Figure 24:
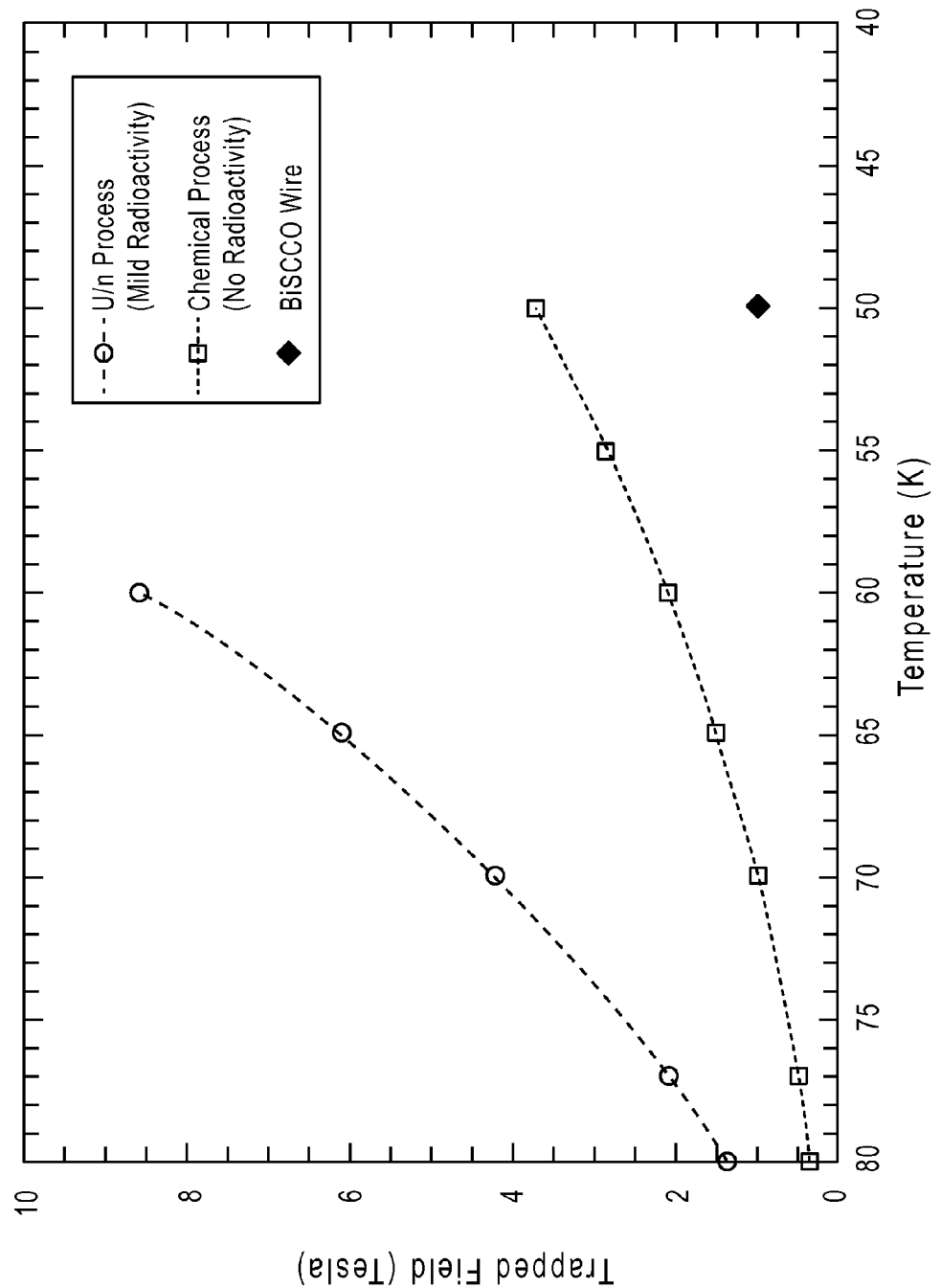
FIG. 24 shows a graph illustrating the improvement of trapped magnetic field $B_T$ with decreasing temperature K for various types of manufactured TFMs.

As used herein the terms "trapped field magnet," "TFM," or variations thereof, refer to superconducting materials that have a significant "trapped" magnetic field, resulting in a quasi-permanent magnetic material. In other words, a TFM is a superconducting material that has been activated to replicate a magnetic field to which it has been exposed, thereby producing its own persistent magnetic field. In particular, high temperature superconductors (HTSs), which are materials that become superconductive above the boiling temperature of liquid nitrogen (77K), can be activated to form TFMs. In various embodiments of the present disclosure, for example, the superconducting material is a HTS material, such as, for example, yttrium barium copper oxide (YBCO). For example, an HTS composed of $YBa_2Cu_3O_{7-\delta}$, becomes superconducting at temperatures below about 93 K. Accordingly, TFMs in accordance with the present disclosure that are made of YBCO can operate at temperatures from about 93 K, down to a temperature of about absolute zero. Furthermore, as illustrated in FIG. 24, in general, the magnetic field held by TFMs increases as the temperature decreases. FIG. 24, for example, illustrates the dependence on temperature for two types of manufactured TFMs. The higher fields shown are for a radiation enhanced TFM, and the lower fields shown are for a chemically enhanced TFM. The single data point at 50 K, 1 Tesla represents an attempt to create a TFM using a HTS wire (a bismuth strontium calcium copper oxide (BiSCCO) wire) rather than a bulk TFM.

In various additional exemplary embodiments, the superconducting material is a HTS material, such as, for example, $RE_1Ba_2Cu_3O_{7-\delta}$, where RE is chosen from Y, Nd, La, Sm, Eu, Gd, Dy, Ho, Er, Tm, Yb, Lu, Tb, or mixtures thereof. In various further embodiments, the HTS is composed of $Bi_2Sr_2CaCu_2O_x$; $(Bi,Pb)_2Sr_2CaCu_2O_x$; $Bi_2Sr_2Ca_2Cu_3O_x$; $(Bi,Pb)_2Sr_2Ca_2Cu_3O_x$; $HgBa_2Ca_2Cu_3O_8$; $HgBa_2CaCu_2O_6$; $TlCaBa_2Cu_2O_x$; $Tl_2Ca_2Ba_2Cu_3O_x$; or $Nd_{1+x}Ba_{2-x}Cu_3O_x$. Those of ordinary skill in the art would understand, however, that the present disclosure contemplates systems and methods for activating TFMs in various superconducting materials, including, for example, various HTS materials, based on the application of the TFM, and is not intended to be limited in any manner to the exemplary materials disclosed and claimed herein. Furthermore, those of ordinary skill in the art would understand that the size of a TFM depends upon the application. Generally, larger TFMs are most desirable. TFMs in current applications, for example, range in size from about 1.5 cm to about 10 cm in diameter. Larger TFMs also can be used, but can pose difficulties in production by present activation techniques.

As used herein the terms "activate," "activating," "activated," "activation," and variations thereof, refer to the occurrence in which a superconducting material is turned from an inert material into a magnet from, for example, exposure to a magnetic field. In other words, a superconducting material may be activated to become a TFM, and a TFM may also be activated by reactivation to maintain and/or recover its magnetic field after having been first activated. A superconducting material is fully activated when it has reached its full magnetization potential from an applied magnetic field and is considered saturated. At the present time TFMs are known to be able to trap fields of over 2 Tesla at the temperature of liquid nitrogen at atmospheric pressure, and 6 Tesla at lower pressures of liquid nitrogen. TFMs have been shown to trap up to 14 Tesla at a temperature of 48 K. A superconducting material is said to be partially activated when it is magnetized, but has not yet reached its full magnetization potential. Furthermore, a fully activated TFM will gradually lose some of its trapped field by a process known as creep. Typically, creep causes a loss of about 3% to about 7% of the field per decade of time. For example, a TFM having a trapped field of 2 Tesla 1 day after activation may lose 0.08 Tesla (4%) by day 10 (after activation). Generally creep loss can be held to about 20% loss after one year, with an additional 4% loss after 10 years. TFMs may also lose magnetic field strength and become only partially activated, for example, by loss of cooling sufficient to maintain the magnetic field.

Various exemplary embodiments of the present disclosure contemplate systems and methods for activating trapped field magnets (TFMs) in a superconducting material, by exposing a superconducting material element to a magnetic field pulse generated by an electromagnet source, such as, for example, an electromagnet. In various embodiments, for example, the superconducting material element, such as, for example, a high temperature superconducting material (HTS) element is disposed proximate the electromagnet source, such that, when a current is run through the electromagnet source, the electromagnet source produces a magnetic field pulse that may activate the superconducting material element. In various embodiments, for example, the electromagnet source may produce a single magnetic field pulse that fully activates the superconducting material element. In various additional embodiments, the electromagnetic source may produce a plurality of magnetic field pulses to achieve a desired level of partial activation.

Various embodiments of the present disclosure contemplate, for example, that a majority of a magnetic field generated by the magnetic field pulse is contained within an area with smaller physical lateral dimensions than the superconducting material element. For example, substantially all of a magnetic field generated by the magnetic field pulse may be contained within an area with smaller physical lateral dimensions than the superconducting material element. In other words, in various exemplary embodiments, substantially the entire magnetic field generated by the magnetic field pulse is contained within an area with smaller physical lateral dimensions than the superconducting element except for small amounts of magnetic field that may be attributed to leakage. In various embodiments of the present disclosure, for example, the leakage is such that about 10% or less of the resulting magnetic flux is outside of the area defined by the physical boundaries of the superconducting material element, for example about 5% or less of the magnetic flux is attributed to such leakage and is outside of the area defined by the physical boundaries of the superconducting material element.

In this manner, the electromagnet source may be positioned such that the magnetic field pulse covers only a portion of the superconducting material element (e.g., in a localized manner), such as, for example, an interior portion of the superconducting material element. In various embodiments, for example, the lateral dimensions (e.g., diameter) of the magnetic field source is smaller than the lateral dimensions (e.g., diameter) of the superconducting material element and the magnetic field source is positioned relative to the superconducting material element such that the magnetic field pulse is directed within an outer peripheral boundary of the superconducting material element. While not wishing to be bound by a particular theory, it is believed that by applying a magnetic field pulse in this relatively localized manner within a boundary of the superconducting material element (i.e., such that the field works on the superconducting material element within an outer peripheral boundary of the superconducting field element), a superconducting material may be more efficiently activated, while applying a magnetic field to the outside of a superconducting material (such that the field is at the periphery of and/or completely surrounds the material) may require a larger pulse to achieve full activation. In other words, it is believed that the applied field $B_A$ should be a function of the radial position r across the superconducting material, with $B_A$ approaching zero at the periphery of the surface of the superconducting material.

Figure 1:
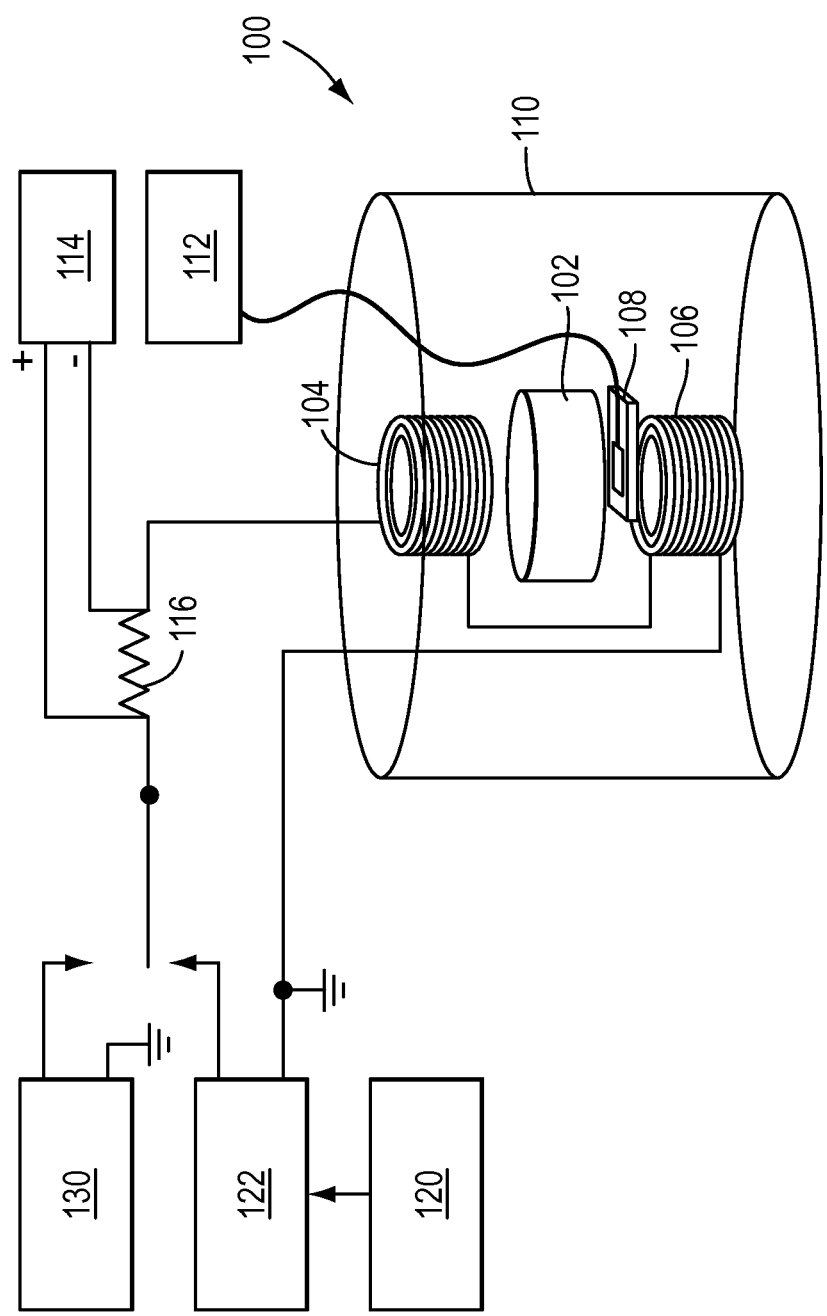
FIG. 1 is a diagrammatic view of an exemplary embodiment of a system for trapped field magnet (TFM) activation in accordance with the present disclosure.

FIG. 1 shows a diagrammatic view of an exemplary embodiment of a system 100 for TFM activation in accordance with the present disclosure. The system 100 comprises a superconducting material element 102 that is disposed between two electromagnets 104 and 106. As shown in FIG. 1, in various exemplary embodiments, the superconducting material has a disk shape (e.g., a puck shape) and is positioned between electromagnets 104 and 106, such that electromagnet 104 is above the superconducting material element 102 and electromagnet 106 is below the superconducting material element 102 in the configuration of FIG. 1. In various exemplary embodiments, the superconducting material element 102 is a high temperature superconducting material as described above, such as, for example, yttrium barium copper oxide. The electromagnets 104, 106 can be wire-wound electromagnets with an iron (or other ferromagnetic) core, comprising a split-field magnet. The electromagnets 104, 106 are wired such that the fields that they produce are in the same direction.

As shown in FIG. 1, in various embodiments of the present disclosure, the diameter of the superconducting disk 102 is greater than the diameter of each of the electromagnets 104 and 106, and the electromagnets 104, 106 are positioned substantially centered on the superconducting disk 102. Accordingly, as described above, when an electric current is run through the electromagnets 104, 106 (via, e.g., a pulse generator 120 and/or a capacitor 130), the electromagnets 104, 106 will each produce a magnetic field pulse that is large only in an area with smaller physical lateral dimensions than the superconducting disk 102. In other words, substantially all of the magnetic field produced by each of the electromagnets 104, 106 will be within a diameter of the superconducting disk 102. In this manner, as described below in more detail, in a prototype that was built and tested (see EXAMPLE 1 below), in various exemplary embodiments, a single magnetic field pulse produced by the electromagnets 104, 106 can fully activate the superconducting disk 102 to produce a fully activated TFM. In various embodiments, for example, a single magnetic field pulse can fully activate the superconducting disk 102. The pulses used had durations ranging from about 10 ms to about 30 ms, but both shorter and longer pulses are effective. In various embodiments, a short pulse is desirable because it uses less energy, and causes less heating of the TFM.

As also described below in more detail, with regard to another prototype that was built and tested (see EXAMPLE 2 below), in various additional embodiments, a plurality of relatively short magnetic field pulses produced by electromagnets (e.g., similar to the electromagnets 104, 106) can partially activate a superconducting disk (e.g., similar to the superconducting disk 102) to a predictable level of activation based, for example, on a governing principal disclosed herein.

In various embodiments of the present disclosure, the system 100 may further include a mechanism to maintain the superconducting disk 102 cold to permit the TFM activation. For example, system 100 can include a cryostat 110 filled, for example, with liquid nitrogen at atmospheric pressure; and the superconducting material 102 and the electromagnets 104, 106 may be disposed within the cryostat 110 to keep the superconducting material 102 cold so that the activated TFM does not lose its magnetic field. Lower temperatures of the coolant permit any given TFM to retain higher fields. Examples of this for two typical types of TFMs are shown in FIG. 24. For example, liquid nitrogen may be kept in a closed container at pressures below atmospheric. In this case, temperatures below 77 K are achievable, and the field trapping ability of the TFM increases significantly, as shown in FIG. 24

Those of ordinary skill in the art would understand that system 100 is exemplary only and intended to illustrate one exemplary embodiment of a system for TFM activation in accordance with the present disclosure. Accordingly, those of ordinary skill in the art would understand that the superconducting disk 102 and electromagnets 104, 106 utilized within the system 100 may have various shapes, dimensions and/or configurations, and be formed from various materials, based, for example, on a particular application and the desired trapped field strength of the TFM. Additionally, although the system 100 utilizes electromagnets 104, 106, systems in accordance with the present disclosure contemplate using any electromagnetic source known to those of ordinary skill in the art to produce the magnetic field pulses. Furthermore, although system 100 includes a cryostat 110 to cool the superconducting material 102, systems in accordance with the present disclosure may utilize any cooling means, device, structure, method, and/or technique known to those of ordinary skill in the art, including, but not limited to, an evaporated cold gas of a low temperature liquid.

Single Pulse Activation

Various design considerations and their impact on the operation of a system for TFM activation, such as that depicted in FIG. 1, will now be described for the activation of a superconducting material element with a single magnetic field pulse from electromagnets similar to the system 100 described above.

Example 1

A prototype, having a set up in accordance with the exemplary system 100 diagrammatically depicted in FIG. 1, was built and tested to confirm and study the activation capabilities of the disclosed exemplary system. Each electromagnet 104, 106 was a wire-wound split field electromagnet with an iron core that was configured with 94 turns of 24-gauge copper magnet wire. The outermost diameter of the electromagnet windings was about 18 mm, and the innermost diameter was about 12 mm (which was set by the ferromagnetic cores of soft iron). The superconducting disk 102 was made of a bulk yttrium barium copper oxide (YBCO), and had a 20 mm diameter with an axial length of about 8 mm. The pinning centers in the superconducting disk 102, as would be understood by those of ordinary skill in the art, were made of $Y_2BaCuO_5$, and were elongated and refined by platinum (Pt) doping.

The system 100 was first activated using the conventional field cooling (FC) technique, as would be understood by those of ordinary skill in the art. When fully activated in air (no iron present) the maximum trapped field ($B_T$) at 77 K was 4,400 gauss (G) at 0.8 mm from the surface of the superconducting disk 102. When fully activated by field cooling with the coils and iron cores attached, the maximum trapped field ($B_T$) at 77 K was 6600 G at 0.7 mm from the outer lateral surface of the superconducting disk 102. The measured values of the trapped fields ($B_T$) theoretically extrapolated to the surface of the superconducting disk 102, were 35% higher. For example, the superconducting disk had a surface field of 5900 G, in air. Further theoretical extrapolation to the mid a, b plane of the superconducting disk 102 yielded a field an additional 60% higher at 9700 G in air. The presence of the iron cores in the electromagnets 104, 106 provided a higher applied field ($B_A$) for a given coil current ($I_{EM}$) by lowering the reluctance of paths for the magnetic flux. In the same manner, the iron cores were found to permit a higher value of maximum trapped field ($B_{T,\,Max}$) for a given value of the critical current ($J_C$) of the HTS used.

As shown in FIG. 1, in various embodiments, a Hall probe array 108 may be disposed between the superconducting disk 102 and the electromagnet 106 to collect data from the system 100. In the prototype tested in Example 1, the Hall probe array 108 was disposed in a 1.4 mm gap between the superconducting disk 102 and the electromagnet 106, such that the probe array 108 was sandwiched about 0.7 mm from the surfaces of the superconducting disk and the iron core of the electromagnet 106. Individual Hall probes (not shown) were spaced about every 1.15 mm to cover the radius of the superconducting disk 102 from 1.7 mm to 8.6 mm of the 10 mm radius of the superconducting disk 102. Data from the Hall probe readouts were logged on a data logger (i.e., PC) 112, using an AREPOC™ interface.

Two pulse types were available for activation of the superconducting disk 102. The first type was produced by a pulse generator, labeled 120 in FIG. 1 that drove a fast rise time current supply, labeled 122 in FIG. 1, having a 20 ms rise time, a 100 ms flat top, and a 20 ms fall time. It was found, however, that with this pulse type activation, magnetic field pulses above 40 amps (A) heated the coils of the electromagnets 104, 106. Accordingly, a second type of pulse was used to generate higher magnetic field pulses (i.e., above 40 amps) using a capacitive discharge, from a 0.125 Farad (F) capacitor, labeled 130 in FIG. 1, rated at 100 volts (V). Circuit resistance was 0.236Ω (±8%) and inductance was negligible. Thus, the RC time of the capacitive discharge pulses was about 29.5 ms.

Figure 2:
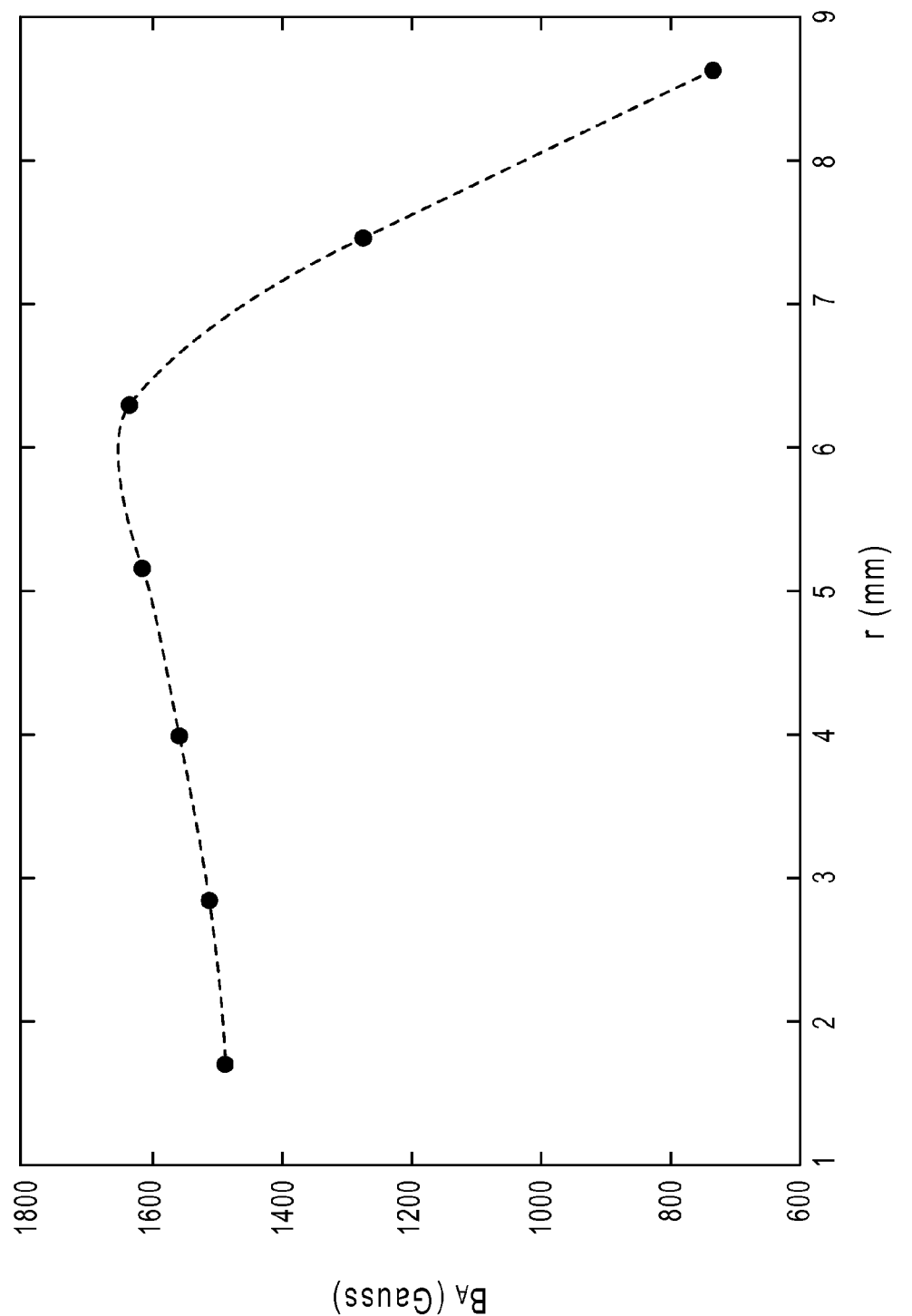
FIG. 2 shows a graph illustrating the applied activating magnetic field $B_A$ as a function of radial position r across an electromagnet (EM) used in the system of FIG. 1, when the current $I_{EM}$ through the EM is 10 amps.

An oscilloscope, labeled 114 in FIG. 1, was used to read voltages across a low resistance shunt, labeled 116 in FIG. 1, for calibration studies and current measurement. FIG. 2, for example, shows a measurement of the field produced by the electromagnets 104, 106, or the applied field ($B_A$), when the current ($I_{EM}$) through the electromagnets 104, 106 was 10 A. To avoid repetitive descriptions, the approximation is used that a current of 10 A produces a field of about 1500 G, i.e., that $B_A$ is approximately 150 G/Amp. This approximation may be amended in the region of core saturation, as would be understood by those of ordinary skill in the art.

As shown in FIG. 2, the concentration of the magnetic field at the periphery of the electromagnet's iron core resulted in a small peak in $B_A$ at a radius (r) of the disk 102 of about 5.5 mm. Accordingly, this field distribution met the objective that much of the field distribution was inside a ring of the superconducting disk 102 (i.e., such that the field worked on the material within the outer peripheral boundaries of the disk 102). The applied field $B_A$ was, therefore, a function of r, and was near zero at the periphery of the superconducting disk 102.

With reference to FIGS. 3-6, the trapped magnetic field $B_T$ was studied as the applied field $B_A$ was varied during the prototype testing. Using the probe array 108, data was taken on the trapped field ($B_T$) as a function of radial position r across the superconducting disk 102, for varying magnitudes of electromagnet current ($I_{EM}$). Using the prototype, testing was conducted wherein the current was varied from 0.3 A to 430 A. At $I_{EM} \leq 40$ A, data was taken using current pulses shaped by the pulse generator 120, and at $I_{EM} > 40$ data was taken using current pulses generated by the capacitor 130.

Figure 3:
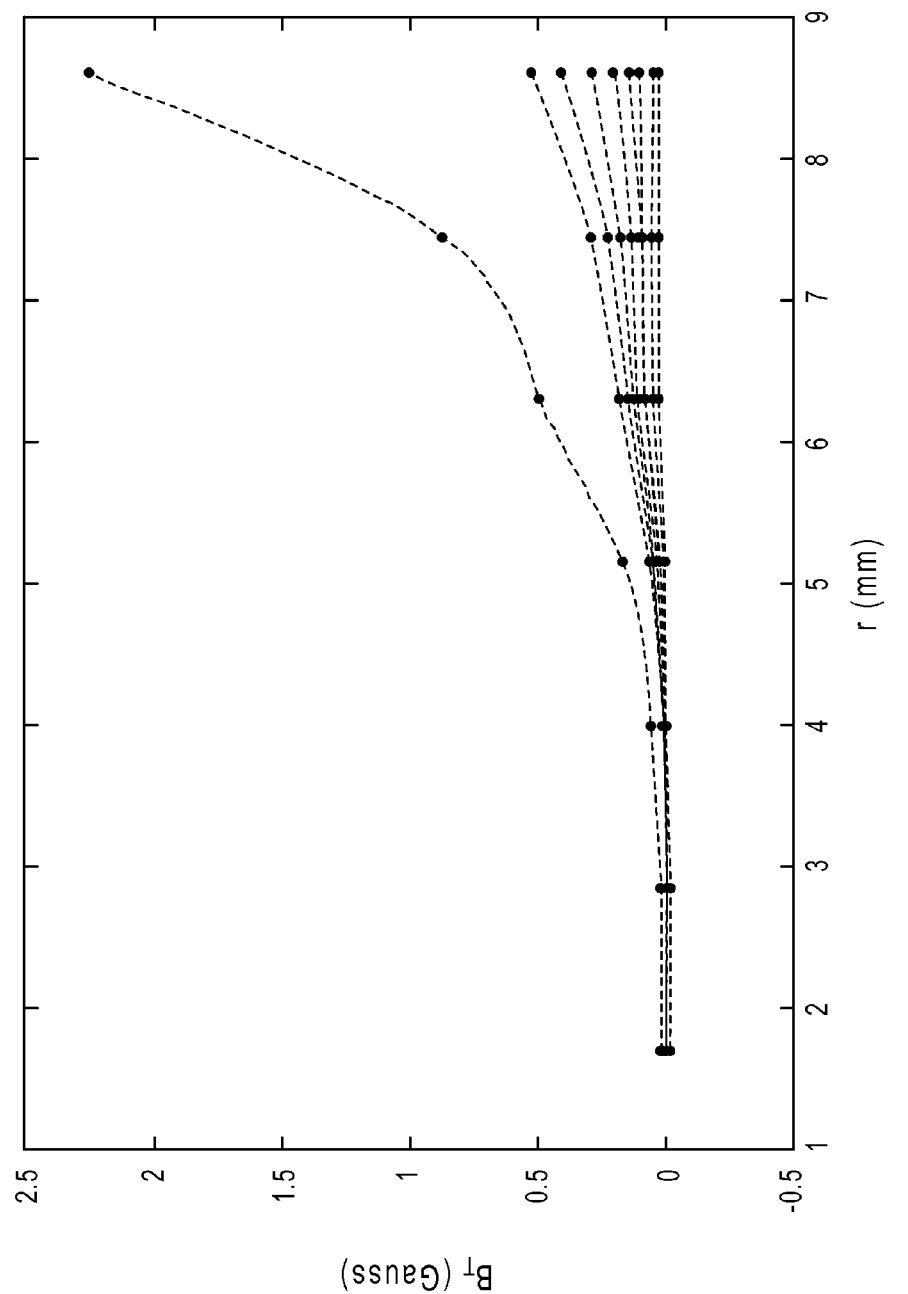
FIG. 3 shows a graph illustrating the trapped magnetic field $B_T$ as a function of radial position r across the TFM in the system of FIG. 1, for an electromagnet current $I_{EM}$ ranging from 0.3 amps to 1.5 amps.

FIG. 3 shows results for the trapped magnetic field ($B_T$) as a function of radial position r across the superconducting disk 102, with coil current as a parameter, for an electromagnet current ($I_{EM}$) ranging from about 0.3 A to about 1.5 A. As illustrated in FIG. 3, $B_T$ became of measureable magnitude in the range $5 \leq r \leq 10$ mm for $I_{EM} \geq 0.3$ A ($B_A \sim 45$ G). Furthermore, $B_T$ was largest at the largest values of r and dropped rapidly as r decreased. $B_T$ remained near zero for r<5 mm. It is also noteworthy that 45 G was far below the first critical field $B_{C1}$, which scientific literature reports to be 200 G-300 G, for fields parallel to the c axis of the disk 102. (see e.g., R. Liang, P. Dosanjh, D. A. Bonn, and W. N. Hardy, "Lower critical fields in an ellipsoid-shaped YBCO single crystal," Phys. Rev. B 50, pp. 4212-4215 (1994)). Thus, in this region the applied field ($B_A$) amplitude was below the critical field $B_{C1}$.

Figure 4:
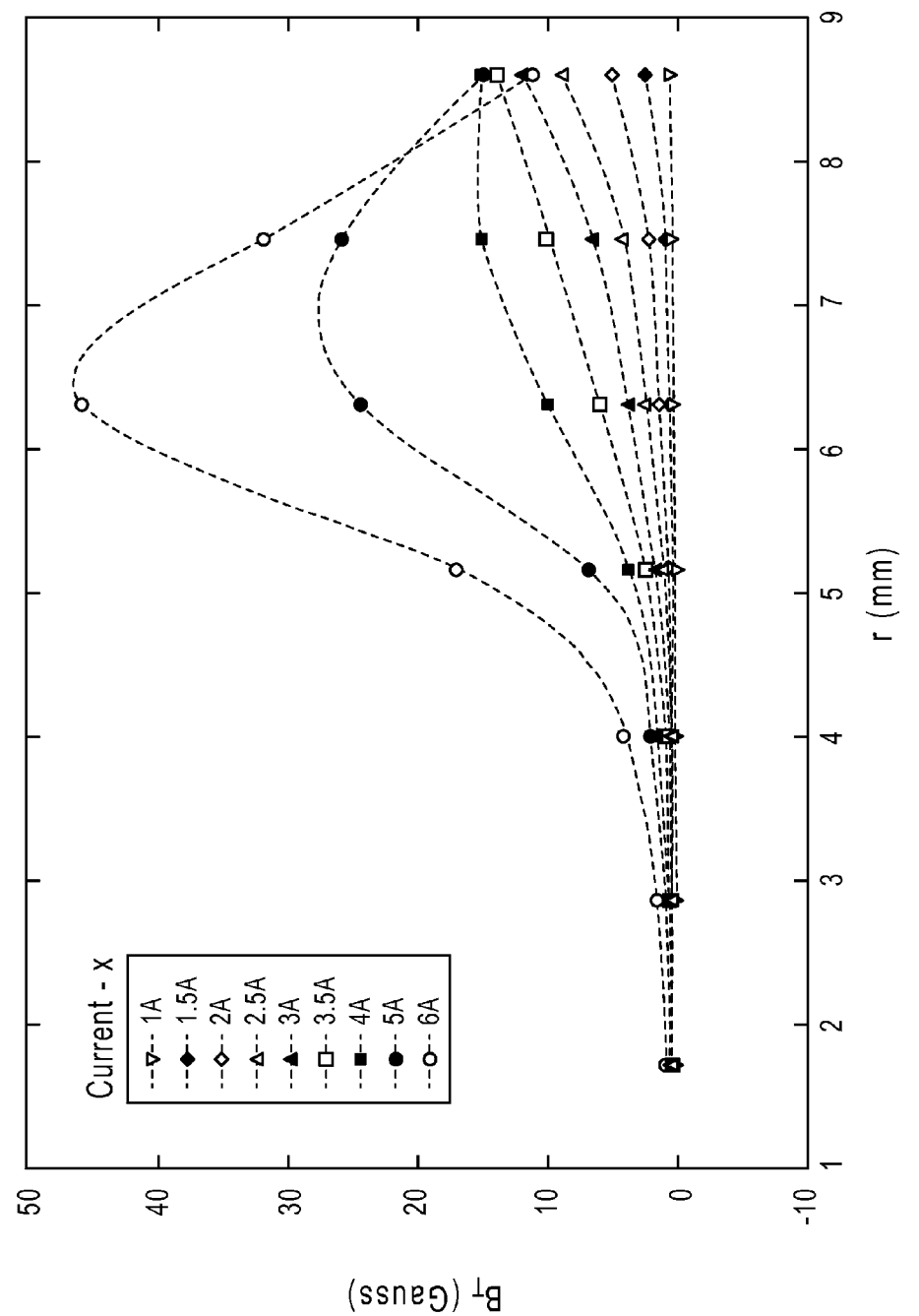
FIG. 4 shows a graph illustrating the trapped magnetic field $B_T$ as a function of radial position r across the TFM in the system of FIG. 1, for an electromagnet current $I_{EM}$ ranging from 1 amps to 6 amps.

FIG. 4 shows results for the trapped magnetic field ($B_T$) as a function of radial position r across the superconducting disk 102, for an electromagnet current ($I_{EM}$) ranging from 1 A to 6 A ($150 \leq B_A \leq 900$ G). As illustrated in FIG. 4, a peak in $B_T$ developed at 6 mm<r<9 mm. This peak was attributable to the peak in the structure of $B_A(r)$ (see FIG. 2). This peak first appeared at r>5.5 mm due to the slope in $B_T$ at large r. But as $I_{EM}$ increases, it would be seen to gradually move toward about 5.5 mm. Thus, as $I_{EM}$ increased, it reached a point at which the peripheral values of $B_T$ are decreased as $B_A$ increases.

Figure 5:
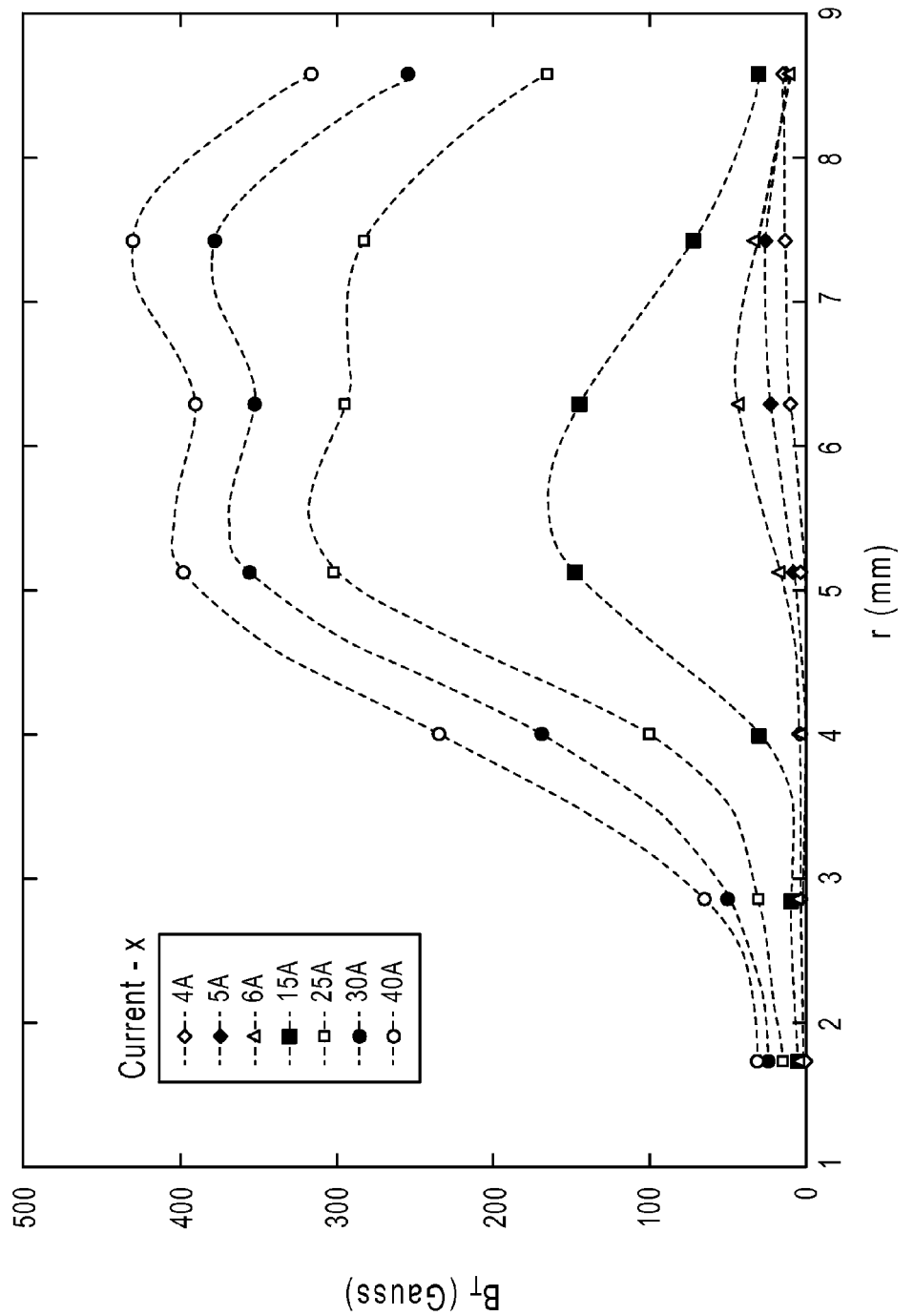
FIG. 5 shows a graph illustrating the trapped magnetic field $B_T$ as a function of radial position r across the TFM in the system of FIG. 1, for an electromagnet current $I_{EM}$ ranging from 4 amps to 40 amps.

FIG. 5 shows results for the trapped magnetic field ($B_T$) as a function of radial position r across the superconducting disk 102, for an electromagnet current ($I_{EM}$) ranging from 4 A to 40 A. As illustrated in FIG. 5, in this region of activation, the peak at the periphery of the superconducting disk 102 grows smaller, the second peak (attributed to $B_A(r)$) migrates toward r~5.5 mm, and a third peak develops. This third peak may be interpreted as the peak predicted by Bean's critical state model for zero field cooled (ZFC) activation. The observed slope ($dB_T/dr$) is proportional to the current density. The slope of the high r side of the third peak increased as $I_{EM}$ increased and, in FIG. 4, has a maximum slope of $dB_T/dr=130$ G/mm. When the superconducting disk 102 was in its fully activated state (see FIG. 6) $dB_T/dr=900$ G/mm. The Bean model, for ZFC activation of an HTS material, for example, predicts that the slope, dB/dr, in this region is constant, and always equal to the slope of the fully activated HTS material. (see e.g., C. P. Bean, "Magnetization of High-Field Superconductors," Rev. Mod. Phys. 36, pp. 31-39 (1964)). Thus, with reference to the data depicted in FIGS. 4 and 5, the HTS current (J) is only equal to $J_C$ when activation is complete. Prior to that J varies through a range from very low values up to $J_C$. This may be complicated by the magnetic field gradually penetrating the superconducting material's layers as $I_{EM}$ increases.

Various embodiments of the present disclosure also contemplate activation of the superconducting disk 102 via a capacitive discharge pulse. As above, during the experiments, with pulse generator pulses of 20 ms rise time, 100 ms flat top, and 20 ms fall time, the electromagnets 104, 106 showed signs of heating if $I_{EM} \geq 40$ A. Accordingly, to avoid heating effects, shorter capacitive-discharge pulse durations may be used. The effects of varying pulse duration were studied and found to be small, but significant. Comparison of $B_T(r)$ resulting from capacitive magnetic field pulses against magnetic field pulsed from a pulse generator was accordingly also considered.

Figure 6:
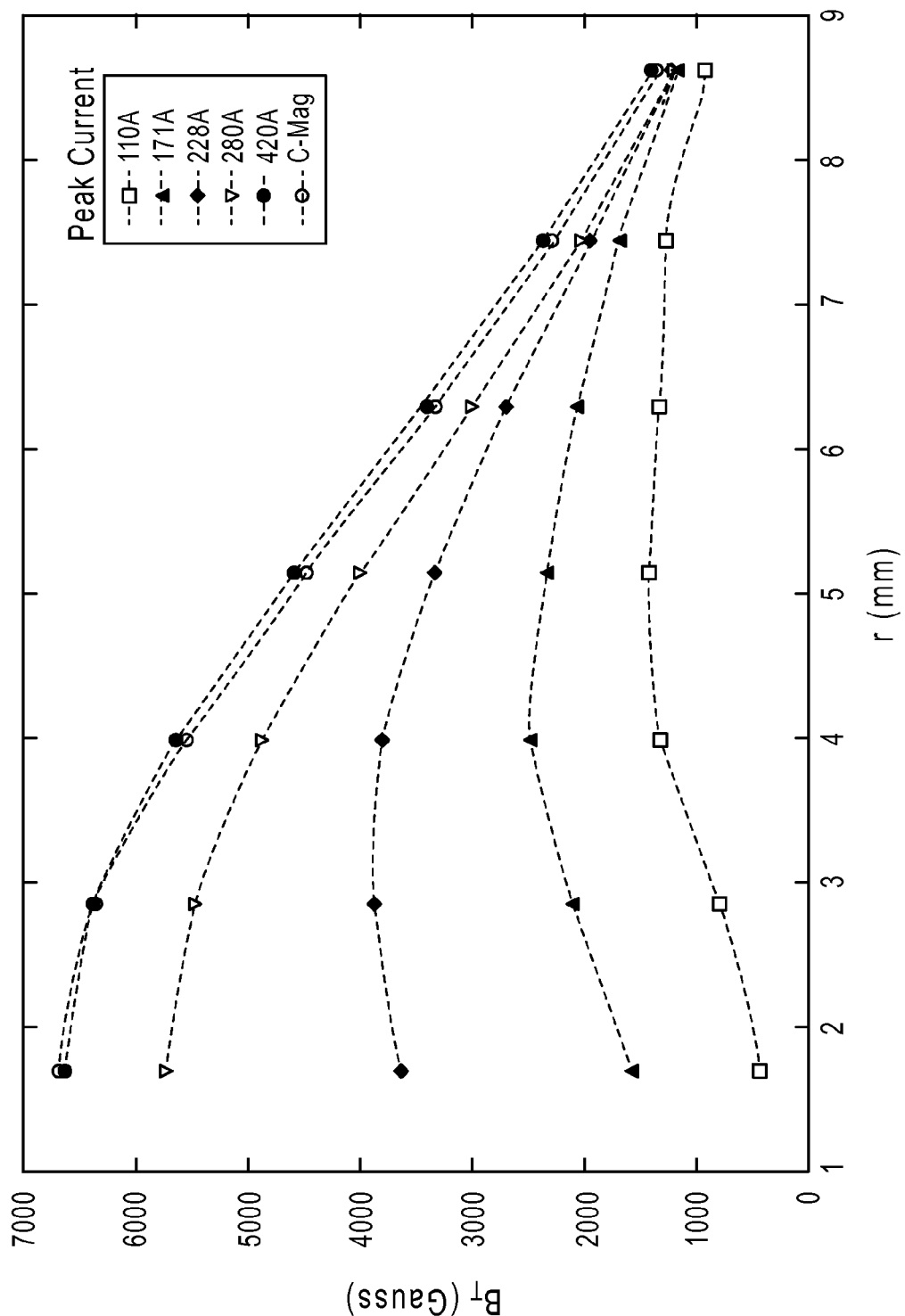
FIG. 6 shows a graph illustrating the trapped magnetic field $B_T$ as a function of radial position r across the TFM in the system of FIG. 1 achieved by both single pulses of electromagnet current 10 amps≤$I_{EM}$≤430 amps and by field cooling to full activation in a constant field.

In further testing, capacitive discharge pulses (e.g., from capacitor 130) having a rise time of about 1 ms and an exponential decay time (RC) of 29.5 ms were applied to the electromagnets 104 and 106, and data was taken (via the probe 108) as the current of the pulses was varied from 110 A to 430 A. FIG. 6 shows results for the trapped magnetic field ($B_T$) as a function of radial position r across the superconducting disk 102 achieved by the capacitive discharge pulses of electromagnet current ($I_{EM}$). As illustrated in FIG. 6, at $I_{EM}=110$ A, there was still a hint of the double peak structure seen at 40 A. As $I_{EM}$ increased, however, $B_T(r)$ for the capacitive pulses approached a limit at $I_{EM}=430$ A, which indicated that the superconducting disk 102 was fully activated (and had reached saturation).

To verify that the superconducting disk 102 was fully activated, the prototype (with the coils and iron cores in place) was inserted into a large electromagnet (a "C" magnet) at a field of 18,000 G, and the superconducting disk 102 was activated by the conventional field cooling (FC) method. FIG. 6 also shows the results for the trapped magnetic field ($B_T$) as a function of radial position r across the superconducting disk 102 achieved by this method, which is represented by the C-Mag data points shown on the plot. As illustrated by FIG. 6, there was a negligible difference between $B_T(r)$ achieved by a single RC pulse of 430 A (~2.9 T) and that obtained by the FC method.

It was found that, because the iron cores of the electromagnets 104, 106 became saturated in the neighborhood of 1 to 2 T, the field no longer scaled with $I_{EM}$. Although the $\mu(H)$ values for the iron used for the cores were not determined, it was found that the applied field ($B_A$) was not strongly dependent on this. It is believed that the lack of sensitivity to $\mu(H)$ in the iron is due in part to the fact that the average $\mu$, including the ferromagnetic and non-ferromagnetic portions of the magnetic circuit, was only about $\mu=3$. If one considers $\mu(H)$ for two widely different materials, soft iron or 1010 steel, in the case of soft iron one can estimate that 430 A corresponds to 3.1 T, while in the case of 1010 steel it corresponds to 2.7 T. Thus, the capacitive discharge pulse height required to completely activate the superconducting disk 102 of the prototype (with iron attached) was concluded to be $B_A \approx 2.9 \pm 0.2$ T.

The results thus demonstrated that the superconducting disk 102 of the prototype was fully activated to $B_{T,MAX} \approx 0.66$ T (6600 G), at Z=0.7 mm, by a single capacitive discharge pulse of 430 A (~2.9 T), with RC decay time of 29.5 ms. Full TFM activation was obtained at $B_A/B_{T,MAX} \approx 4.4$. For $B_T$, at the TFM surface $B_A/B_{T,MAX}^s \approx 3.3$. Accordingly, full activation was obtained by a single pulse of applied field $B_A$ about 3.3 times the maximum trapped field ($B_{T,MAX}$) on the surface of the superconducting material element.

Figure 7:
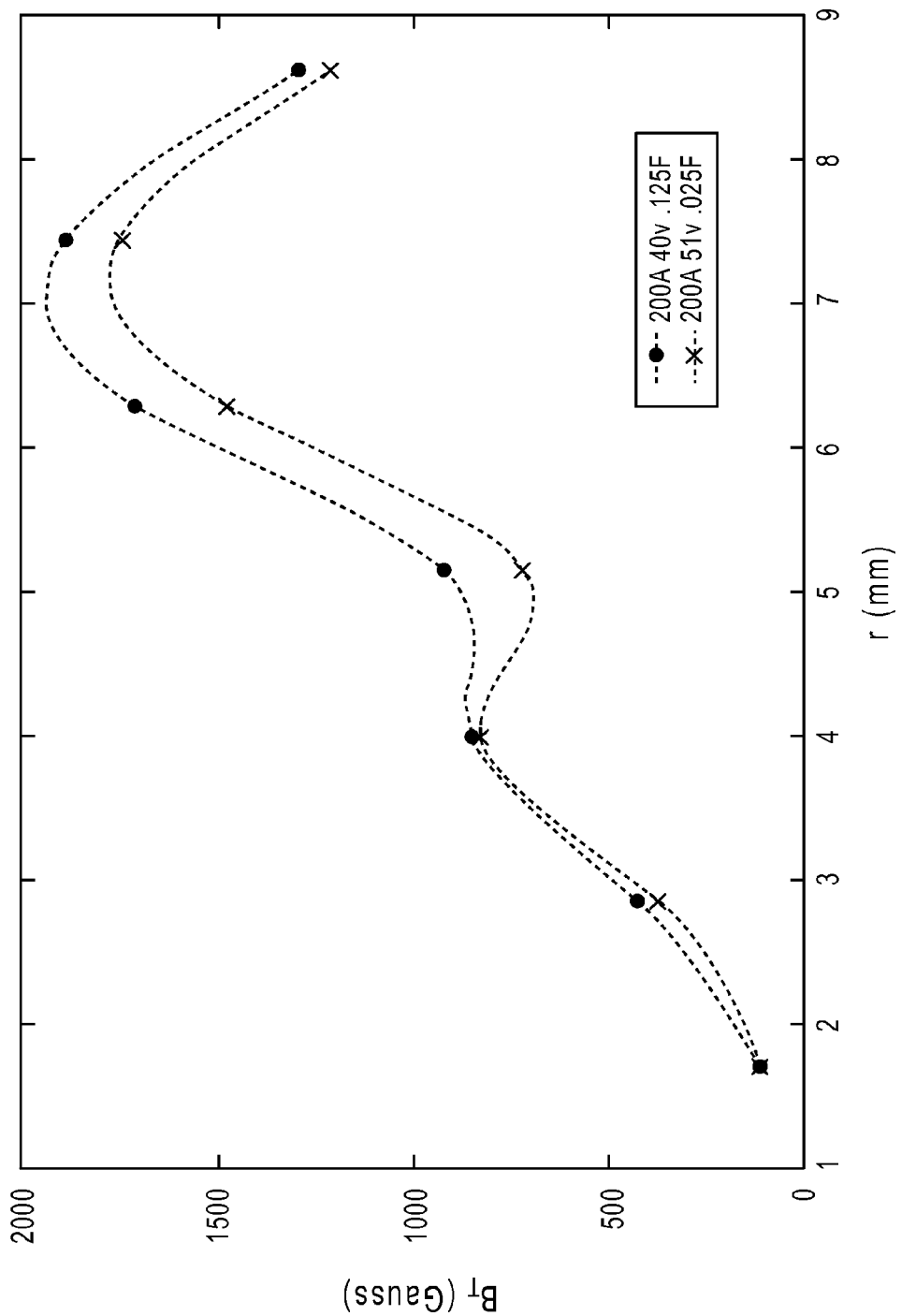
FIG. 7 shows a graph illustrating the trapped magnetic field $B_T$ as a function of radial position r across another exemplary embodiment of a TFM in accordance with the present disclosure, achieved by single pulses of electromagnet current $I_{EM}$ of differing durations.

Various embodiments further contemplate using a single capacitive discharge pulse with a shorter length, such as, for example, an RC decay time of 10 ms. FIG. 7, for example, shows data from another prototype testing of a system similar to the system 100 of FIG. 1, which used a TFM having a higher trapped field. FIG. 7 demonstrates the trapped magnetic field ($B_T$) as a function of radial position r across a superconducting disk achieved by a single 30 ms pulse of electromagnet current $I_{EM}$ and by a single 10 ms pulse of electromagnet current ($I_{EM}$). The 30 ms pulse was produced with a capacitor of 0.125 F and the 10 ms pulse was produced with a capacitor of 0.025 F, and both pulses were adjusted to supply 200 A to the electromagnet coils to produce the same magnetic pulse height. As illustrated in FIG. 7, within the errors of setting up a change in the prototype system to obtain equal currents, the two results were the same with each pulse producing the same amount of partial activation. According, it was determined that a significant change in pulse length (e.g., by a factor of 3) does not significantly change the resulting trapped magnetic field ($B_T$).

Figure 8:
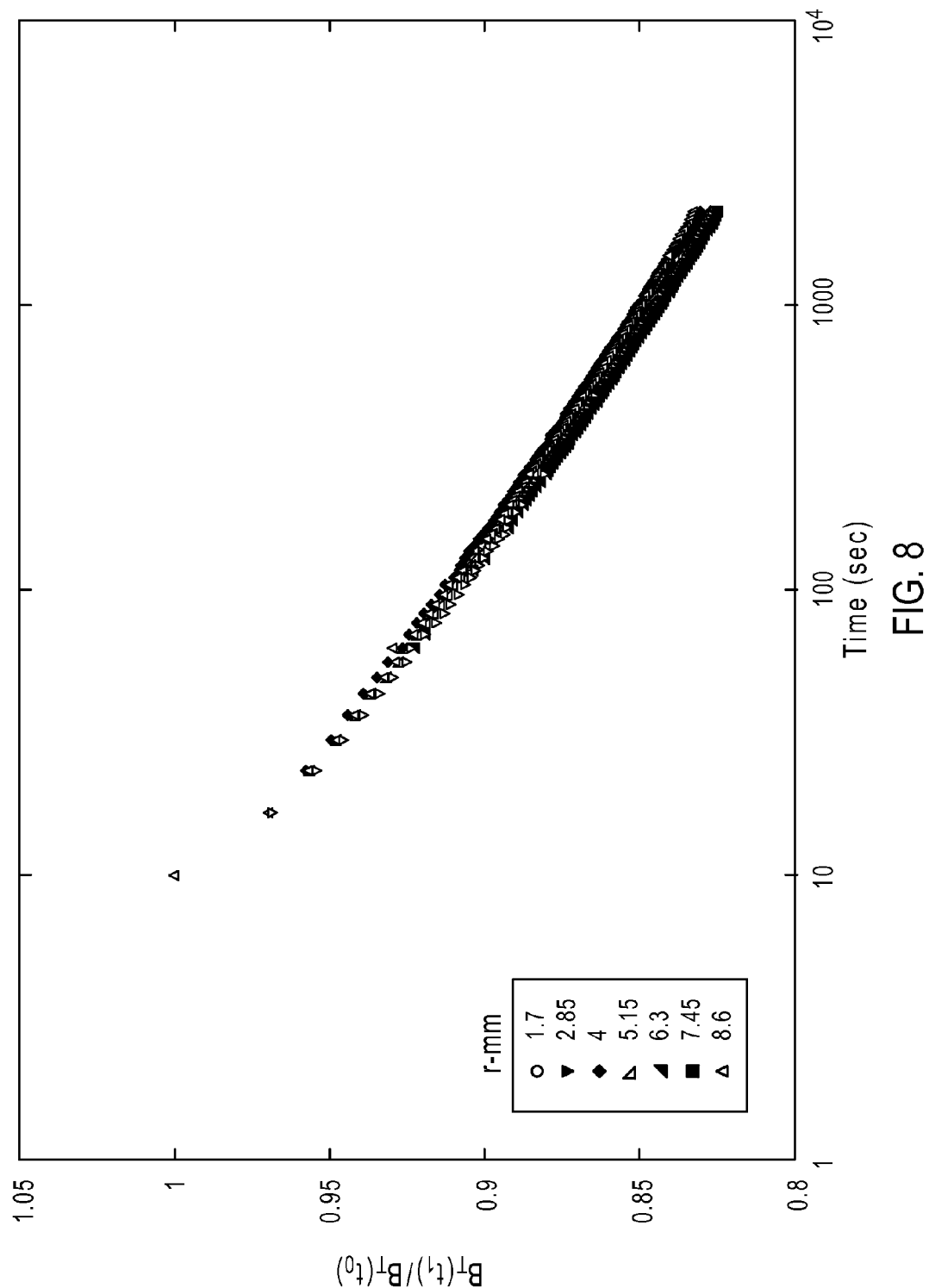
FIG. 8 shows a graph illustrating the creep rate $B_T(t_1)/B_T(t_0)$ as a function of radial position r across the TFM in the system of FIG. 1, when the TFM is fully activated by a pulse of current $I_{EM}$ of 430 amps through the electromagnet.
Figure 9:
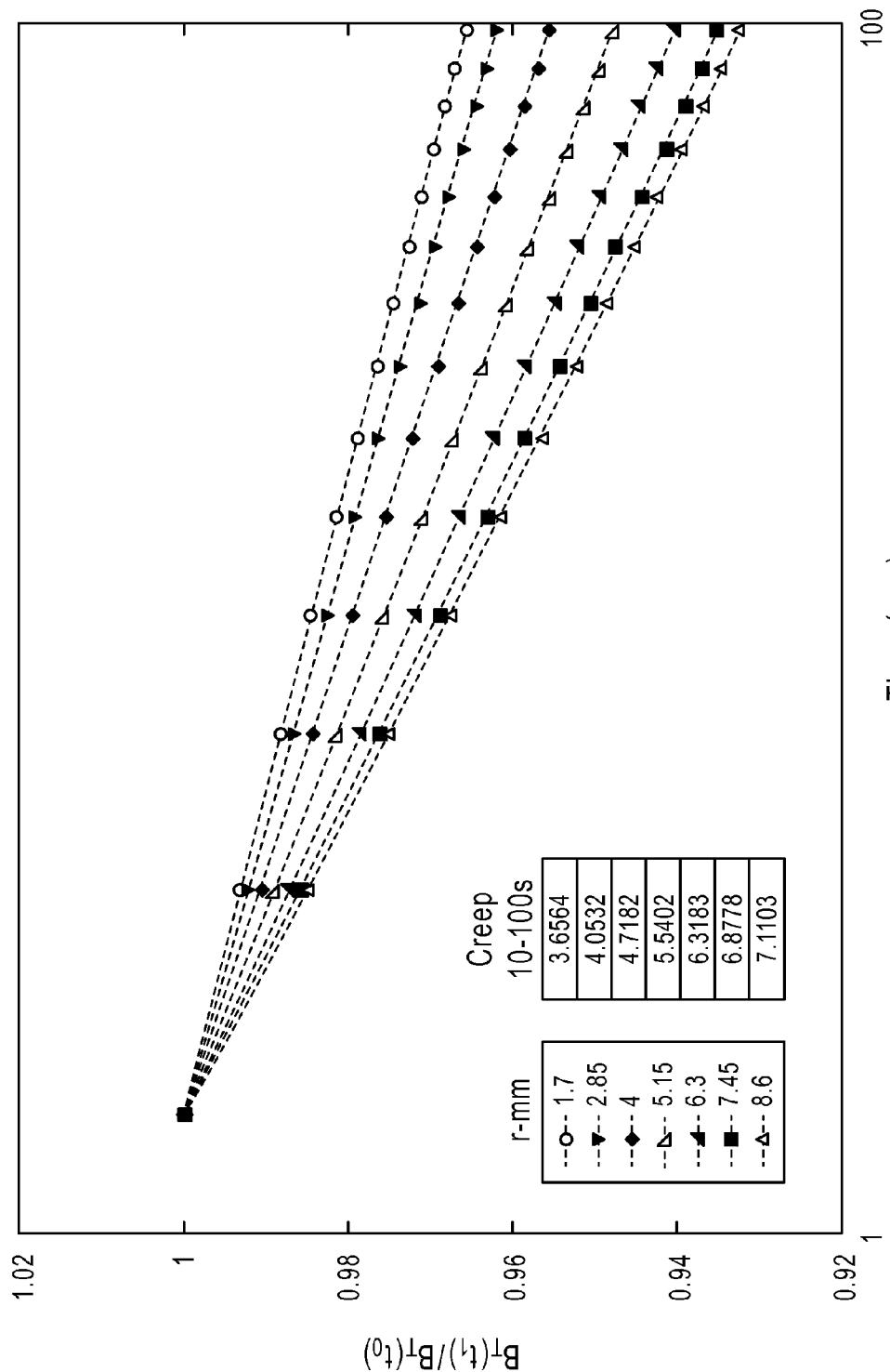
FIG. 9 shows a graph illustrating the creep rate $B_T(t_1)/B_T(t_0)$ as a function of radial position r across the TFM in the system of FIG. 1, when the TFM is partially activated at an electromagnet current $I_{EM}$ of 254 amps.
Figure 10:
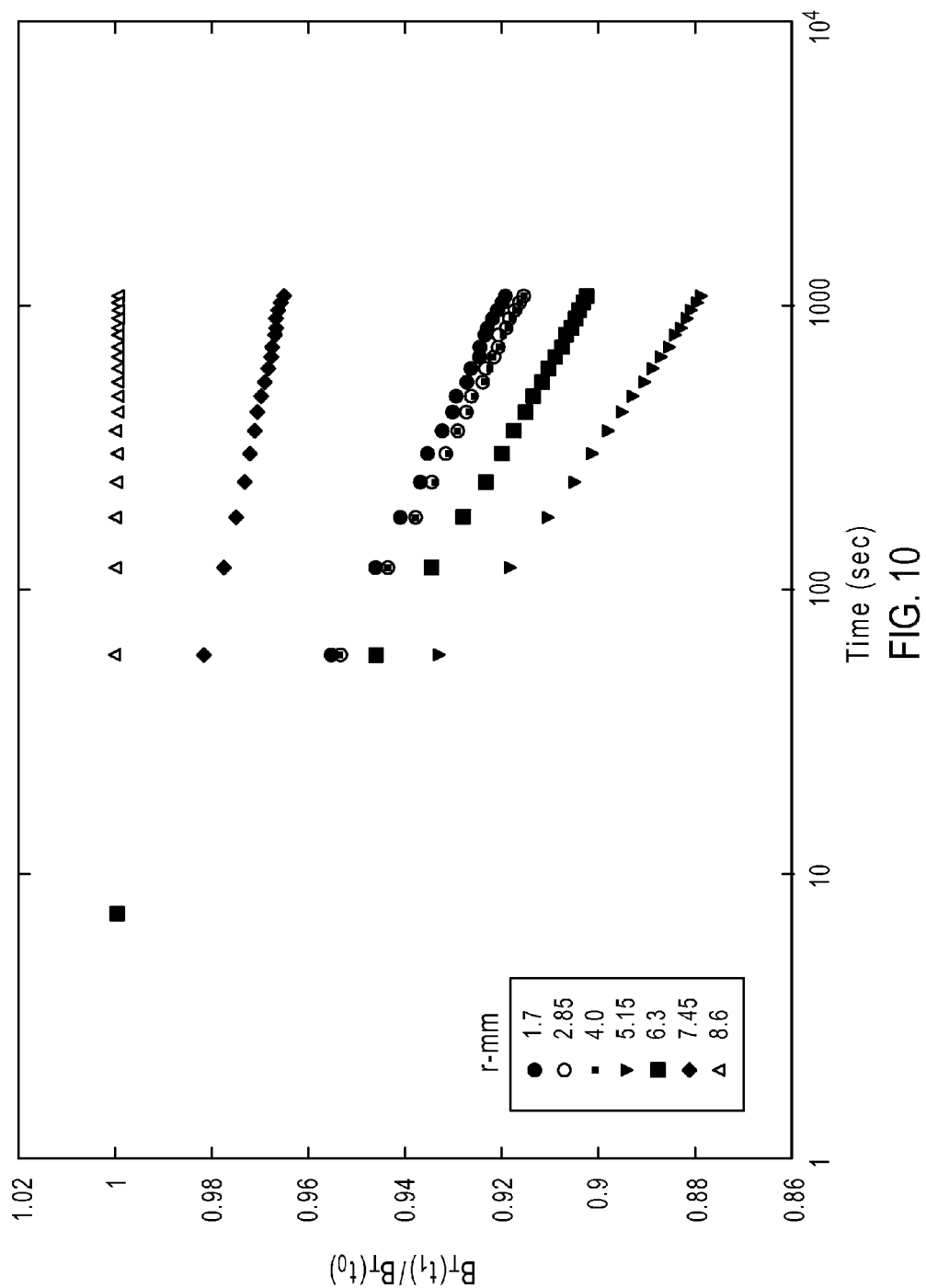
FIG. 10 shows a graph illustrating the creep rate $B_T(t_1)/B_T(t_0)$ as a function of radial position r across the TFM in the system of FIG. 1, when the TFM is partially activated at an electromagnet current $I_{EM}$ of 20 amps.

As shown in FIGS. 8-10, in further testing, creep rates were measured as a function of radial position r across the superconducting disk 102 for several values of the activation pulse height. Creep measurements started 20 s following the applied magnetic field pulse.

As would be understood by those of ordinary skill in the art, the loss of $B_T$, following activation, is very nearly a constant decrease per decade of time. For $t_2 > t_1$, $$B_T(t_2) = B_t(t_1)\left[1 - b\log\frac{t_2}{t_1}\right], \quad (1)$$

where creep (b) (which is the % decrease in field per decade of time) is almost time independent. In the following, creep is quantified by noting the value of b.

FIG. 8 shows the creep rate $B_T(t_1)/B_T(t_0)$ as a function of radial position r across the superconducting disk 102, when the disk 102 has been fully activated by a pulse of electromagnet current ($I_{EM}$) of 430 A. As illustrated in FIG. 8, the creep (b) at all values of r are very nearly the same for this case. The value of b≈7% per decade of time was observed.

FIG. 9 shows the creep rate $B_T(t_1)/B_T(t_0)$ as a function of radial position r across the superconducting disk 102, when the disk 102 has been partially activated by a pulse of electromagnet current ($I_{EM}$) of 254 A. As illustrated in FIG. 9, at this partial activation, the creep (b) is a function of r, and the value of b varies monotonically with r from b<4% at r=1.7 mm to b>7% at r=8.6 mm.

FIG. 10 shows the creep rate $B_T(t_1)/B_T(t_0)$ as a function of radial position r across the superconducting disk 102, when the disk 102 has been partially activated by a pulse of electromagnet current ($I_{EM}$) of 20 A ($B_A \approx 3000$ G). As illustrated in FIG. 10, at this partial activation b not only varied with r, but the variation was no longer monotonic. At r=1.7 mm, b was essentially zero; b then increased to a maximum of ~5% at r=5.15 mm, and then decreased for higher values of r.

Accordingly, the above experimental testing confirmed that when the field applied to activate the superconducting disk was localized, such that substantially the entire field was limited in radius to a value smaller than the radius of the superconducting disk, full activation can be obtained by a single pulse of applied field. Furthermore, for partial activation of the superconducting disk, creep (b) was found to vary with radial position r across the superconducting disk. As full activation was approached, however, the disparate values of b coalesced to a single value. For, example, in accordance with the embodiment tested, b was about 7% at full activation. Various embodiments of the present disclosure may, therefore, provide systems and methods for TFM activation that provide for activating superconducting material elements to become fully activated TFMs or activations that that are only partial, and are minimally affected by creep.

Multiple Pulse Activation

Experiments were also conducted to determine the effects of multi-pulse activation, for example, to compare the activation capabilities of a series of very short magnetic field pulses with the activation capabilities of a single magnetic field pulse. The results and conclusions of these experiments are described below.

Example 2

Figure 11:
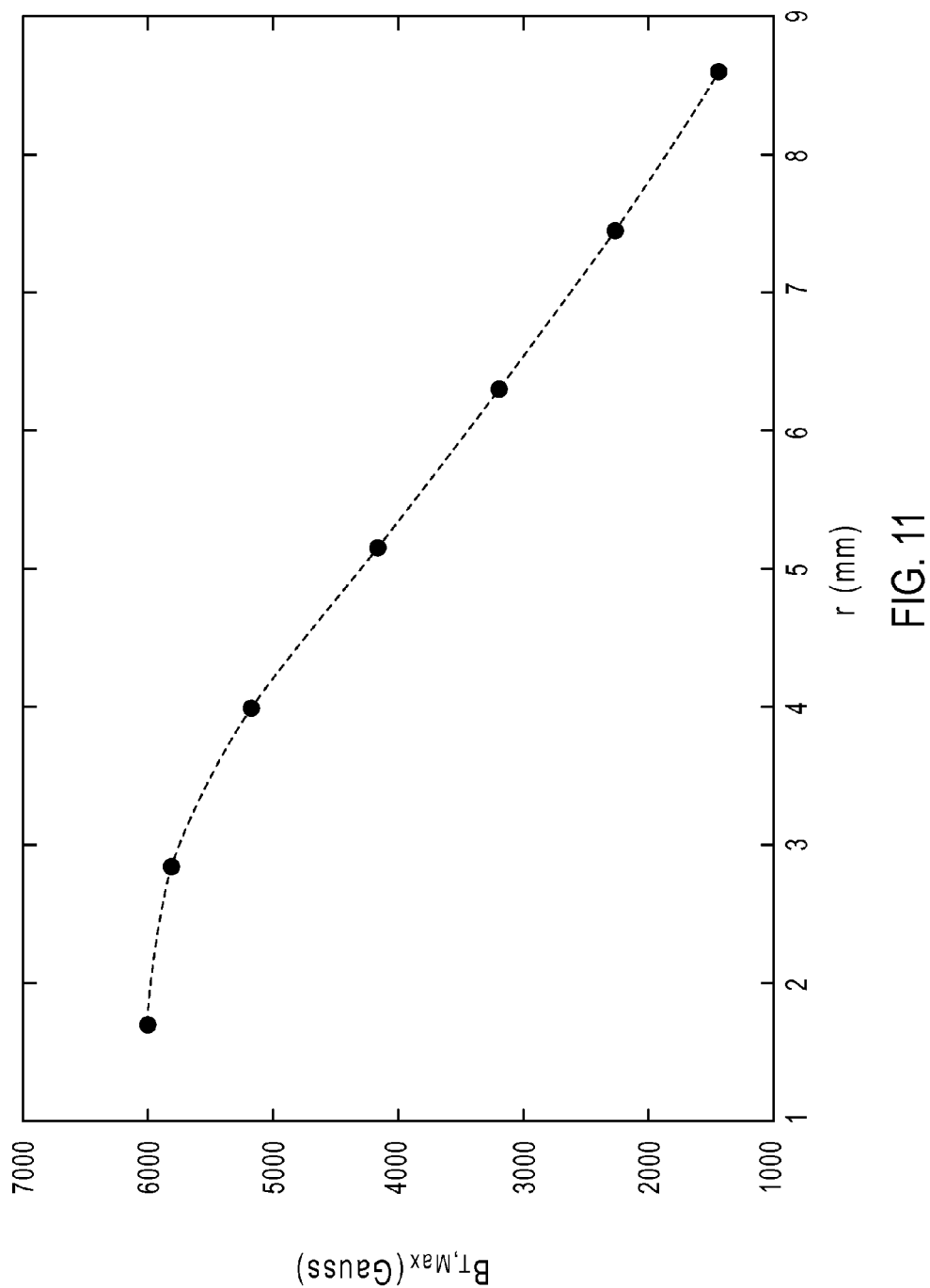
FIG. 11 shows a graph illustrating the trapped magnetic field $B_T$ as a function of radial position r across a TFM in another exemplary system for TFM activation in accordance with the present disclosure.

Following the above study of single pulse activation and varying magnetic field pulse height, another prototype similar to that used in EXAMPLE 1 was built to the same specifications as described above, however, allowable errors could and did change between the two prototype systems. For example, in the second prototype system of EXAMPLE 2, the Hall probe array 108 was positioned 0.8 mm from the surface of the superconducting disk 102, rather than 0.7 mm as in the above experiments. This change, albeit small, nevertheless reduced Hall probe trapped field readings by about 10%. Thus, the peak trapped field ($B_T$) readings (see FIG. 11) for the second prototype system of EXAMPLE 2 were lower than in the above experiments by about 10%. As shown in FIG. 3, in the prototype system of EXAMPLE 2, full activation was read as 6007 G (compared to 6600 G for the prototype system of EXAMPLE 1).

As above, two pulse types were used for activation of the superconducting disk 102. A pulse generator that drove a fast rise time current supply having a 20 ms rise time, a 100 ms flat top, and a 20 ms fall time was used for magnetic field pulses less than or equal to 40 A; and a capacitive discharge, from a 0.125 F capacitor rated at 100 V, was used for magnetic field pulses greater than 40 A. As above, the RC time of the capacitive discharge pulses was about 29.5 ms.

It has been determined that an increase in trapped field ($B_T$) depends on the radial position, r, at which the field on the superconducting material element is measured, the magnitude of the pulse of applied field (as measured by the electromagnet current, $I_{EM}$), and the number of pulses, N ($B_T = B_T(r, I_{EM}, N)$).

Figure 12:
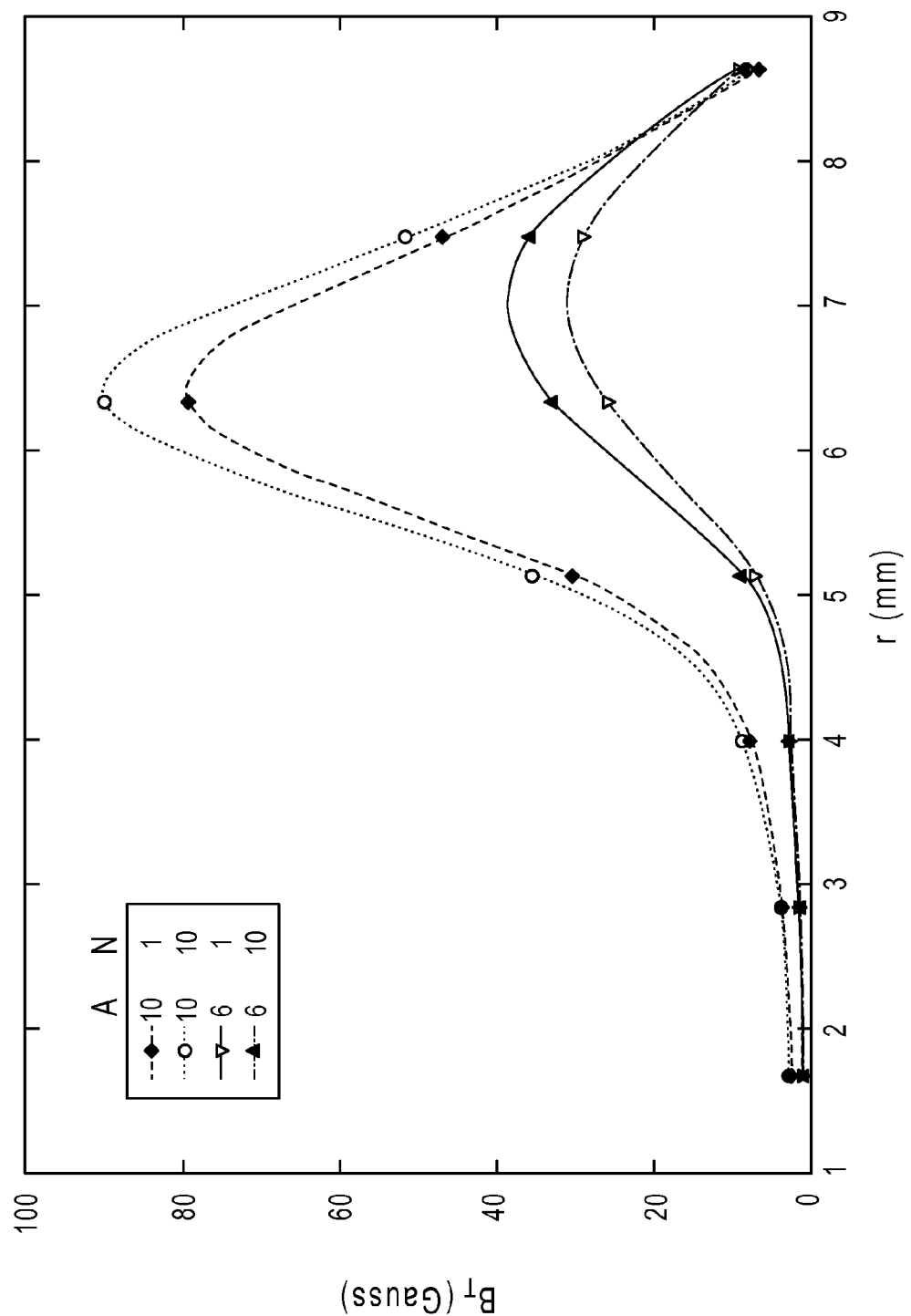
FIG. 12 shows a graph illustrating the trapped magnetic field $B_T$ as a function of radial position r across the TFM in FIG. 11 for various numbers N of activation pulses at various electromagnet currents $I_{EM}$.
Figure 13:
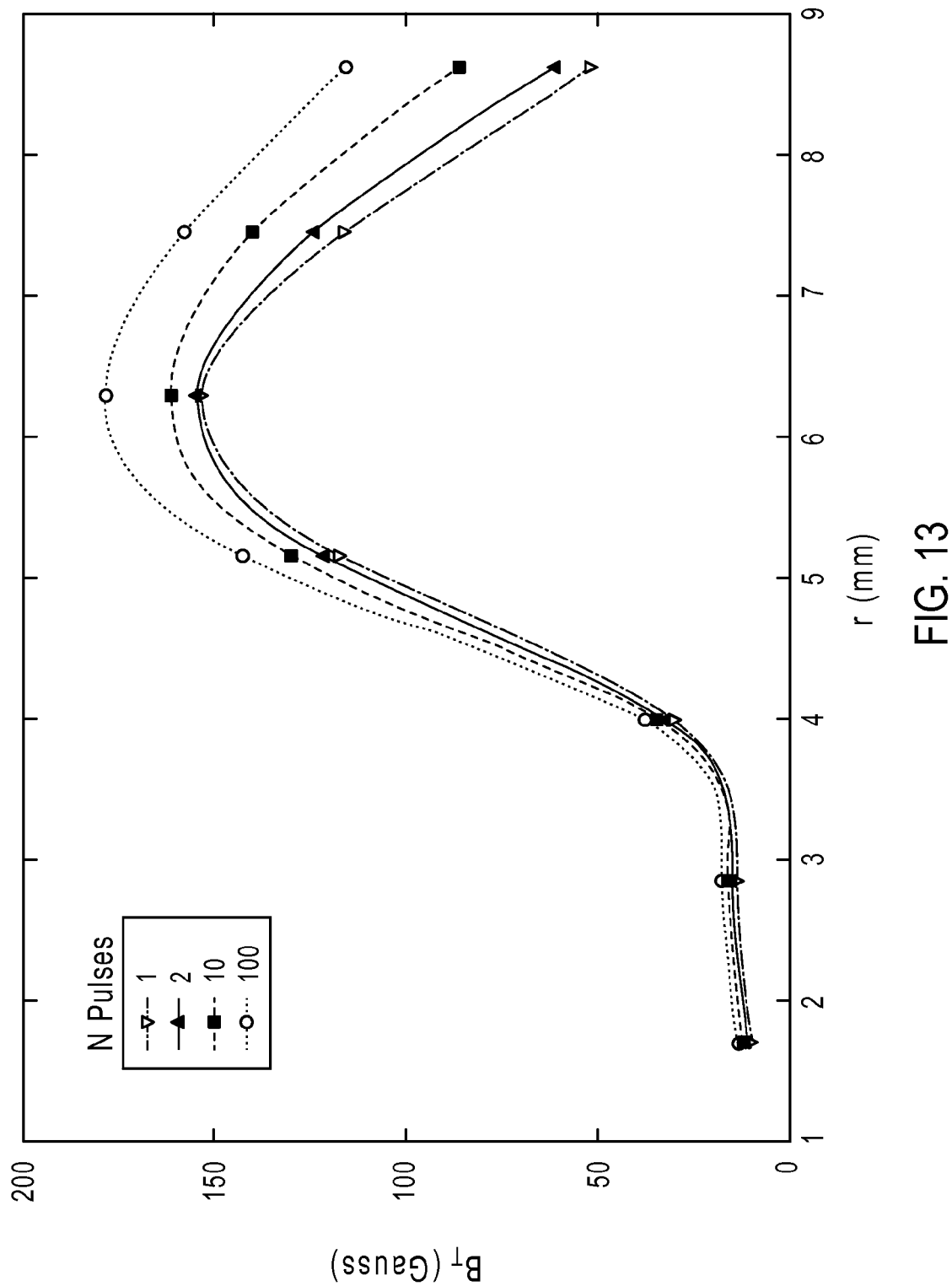
FIGS. 13-16 show graphs illustrating trapped magnetic field $B_T$ as a function of radial position r across the TFM in FIG. 11 for various numbers N of activation pulses at various electromagnet currents $I_{EM}$.
Figure 14:
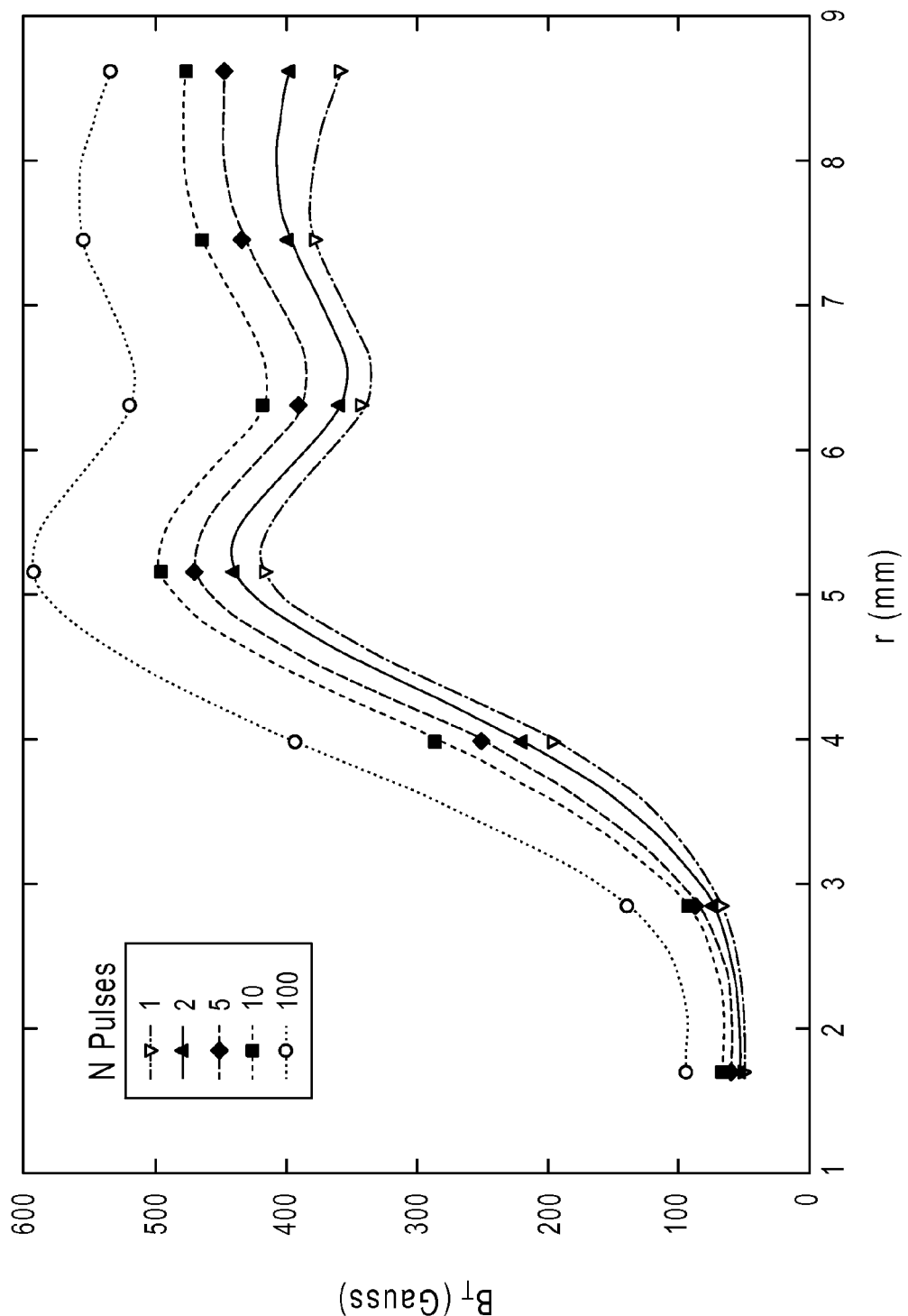
Figure 15:
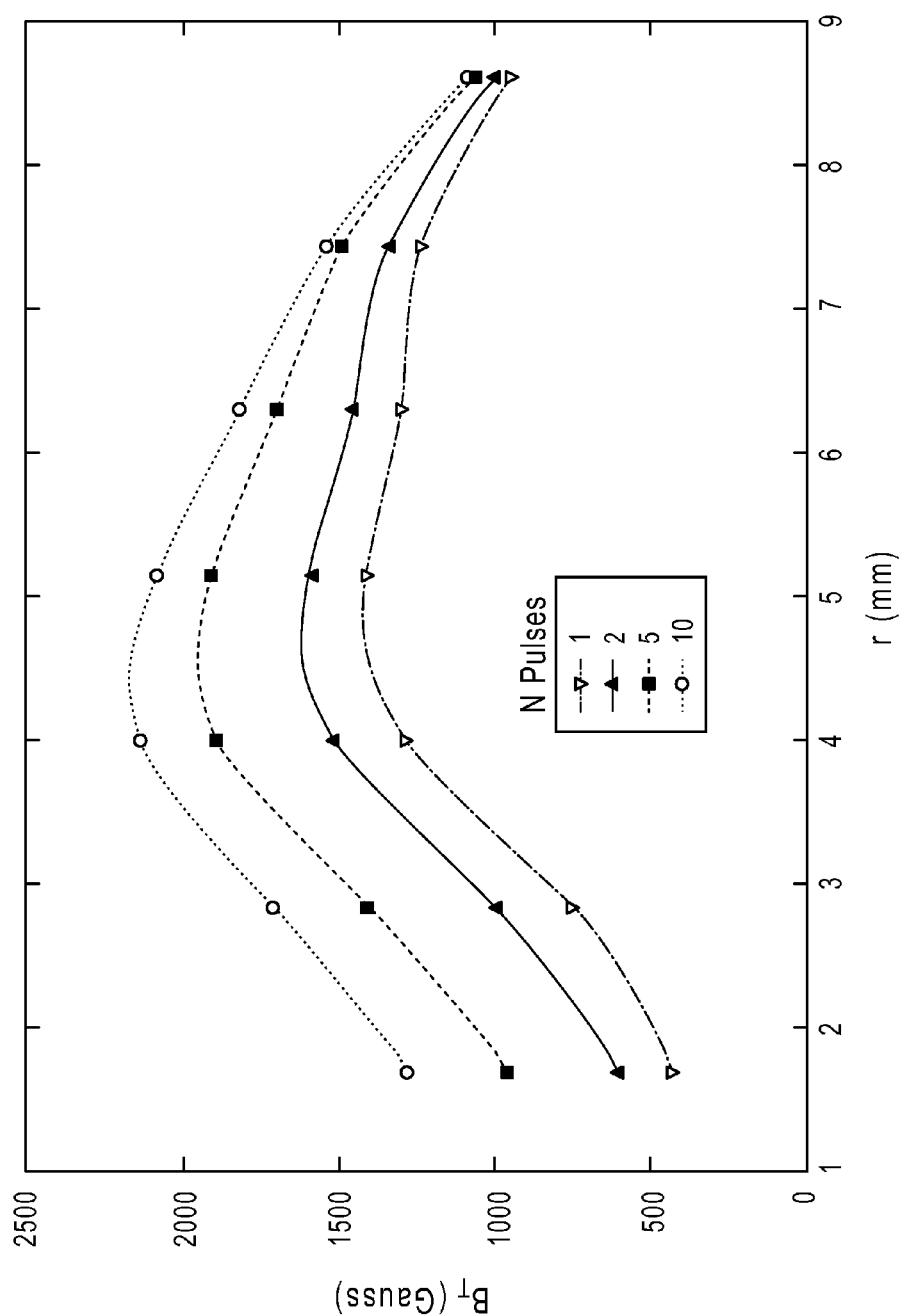
Figure 16:
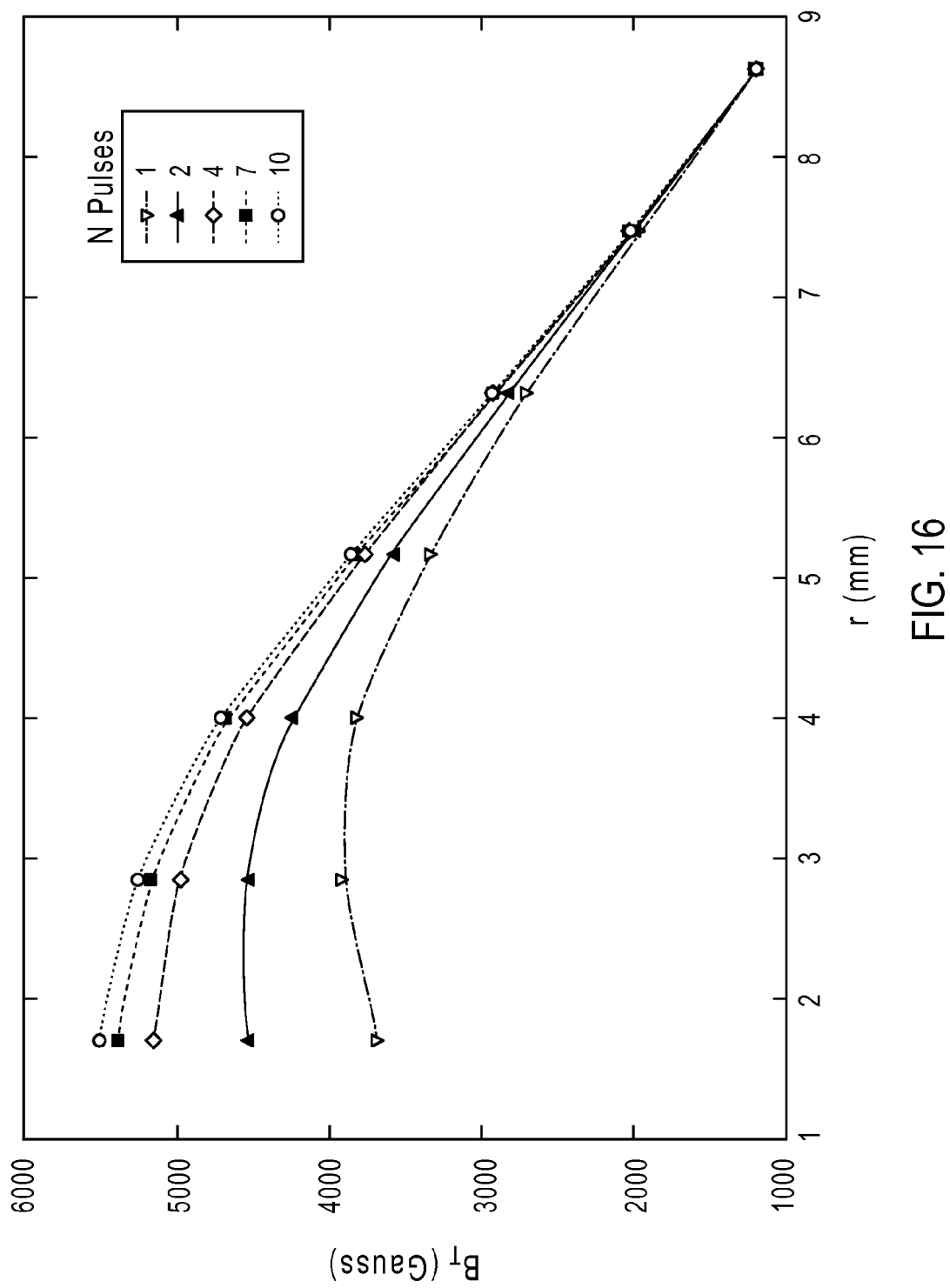
Figure 17:
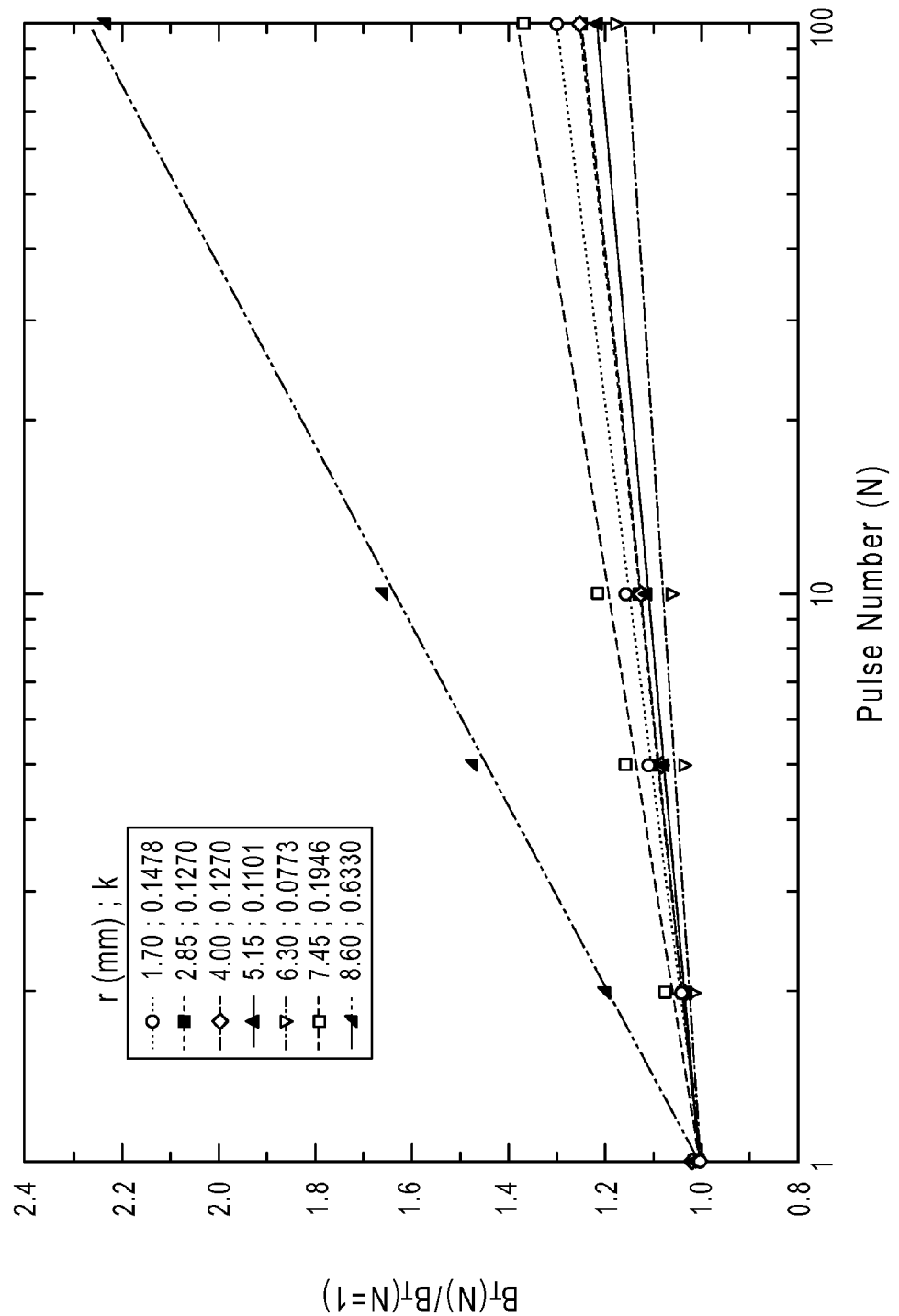
FIGS. 17-20 show graphs illustrating the trapped magnetic field $B_T$ as a function of pulse number N for various radial positions r across the TFM in FIG. 11, at various electromagnet currents $I_{EM}$.

FIGS. 12-16 show results measured for the trapped magnetic field ($B_T$) as a function of radial position r across the superconducting disk 102 of the EXAMPLE 2 prototype, following N multiple activation pulses at an increasing range of electromagnetic currents ($I_{EM}$). FIGS. 12-16, therefore, show $B_T$ vs. r, with N as a parameter at fixed values of $I_{EM}$. FIG. 12 compares results for $B_T(r)$ for a single pulse (N=1) with multiple pulses (N=10) at $I_{EM}$=6 A and $I_{EM}$=10 A. FIGS. 13-16 show results for $B_T(r)$ for various numbers N of activation pulses at respective electromagnet currents of $I_{EM}$=20 A, 40 A, 110 A, and 228 A.

In order to analyze the dependence of the trapped magnetic field ($B_T$) on the number of pulses N applied, graphs of $B_T$ vs. N, with r as a parameter, can be generated. Accordingly, FIGS. 17-20 illustrate this functional relationship ($B_T$ as a function of pulse number N) normalized to the value of $B_T(r, N=1)$, which isolate the radial position r as a parameter at fixed values of $I_{EM}$ (i.e., $I_{EM}$=20 A, 110 A, 170, and 280). The data for each of the FIGS. 17-20 is shown on a semi-log graph in order to emphasize that the data follows the form:

$$\frac{B_T(r, N)}{B_T(r, N=1)} = 1 + k \log N \quad (2)$$

where k is independent of N, but dependent upon r and $I_{EM}$. The values of k that were used are presented in TABLE 1 below:

TABLE 1

Values of k(r, $I_{EM}$)

| r(mm) | $I_{EM}$(A) | | | | | | | | |
|---|---|---|---|---|---|---|---|---|---|
| | 10 | 20 | 50 | 65 | 92 | 110 | 170 | 228 | 280 |
| 1.70 | 0.372 | 0.339 | 0.365 | 0.356 | 0.610 | 0.842 | 0.873 | 1.280 | 1.322 |
| 2.85 | 0.685 | 0.392 | 0.386 | 0.364 | 0.532 | 0.627 | 0.739 | 1.115 | 1.246 |
| 4.00 | 0.777 | 0.398 | 0.244 | 0.233 | 0.317 | 0.400 | 0.574 | 1.000 | 1.195 |
| 5.15 | 0.573 | 0.367 | 0.246 | 0.361 | 0.341 | 0.268 | 0.529 | 1.004 | 1.245 |
| 6.30 | 0.434 | 0.022 | 0.335 | 0.377 | 0.439 | 0.348 | 0.575 | 1.066 | 1.382 |
| 7.45 | 0.252 | 0.488 | 0.347 | 0.364 | 0.464 | 0.415 | 0.591 | 1.367 | 1.906 |
| 8.60 | 0.751 | 0.646 | 0.394 | 0.469 | 0.536 | 0.490 | 0.655 | 0.441 | 1.752 |

Accordingly, as N increases, the increment in trapped field decreases as d(log N)=(k/N)dN. As the number of pulses increases, the increase in $B_T(r, N)$ for the Nth pulse varies as k/N:

$$\frac{\Delta(B_T[r, N])}{B_T[r, N=1]} = \left(\frac{k}{N}\right), \quad (3)$$

In other words, the effectiveness of the Nth pulse to cause an increase in $B_T$ decreases as 1/N.

Figure 18:
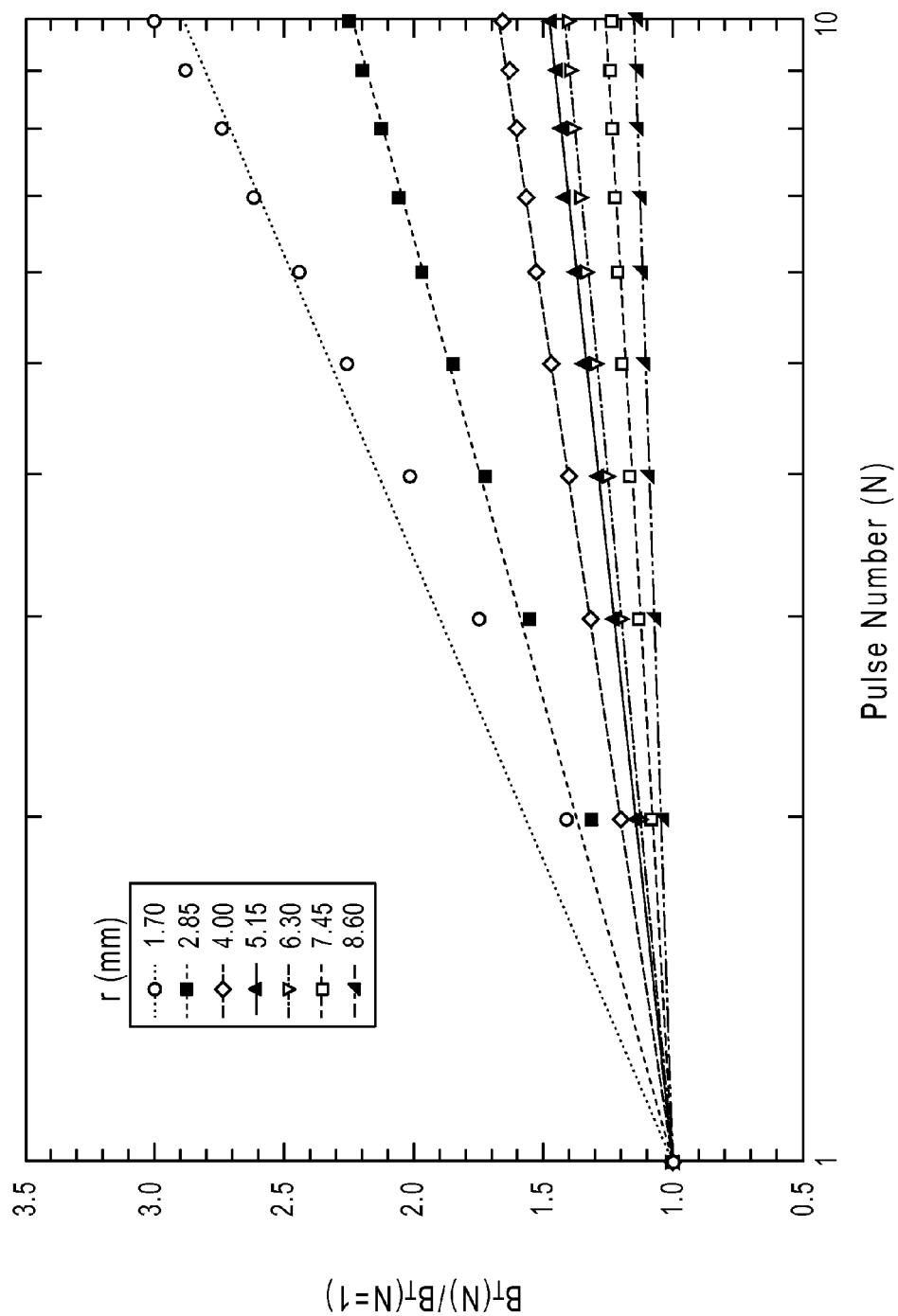
Figure 19:
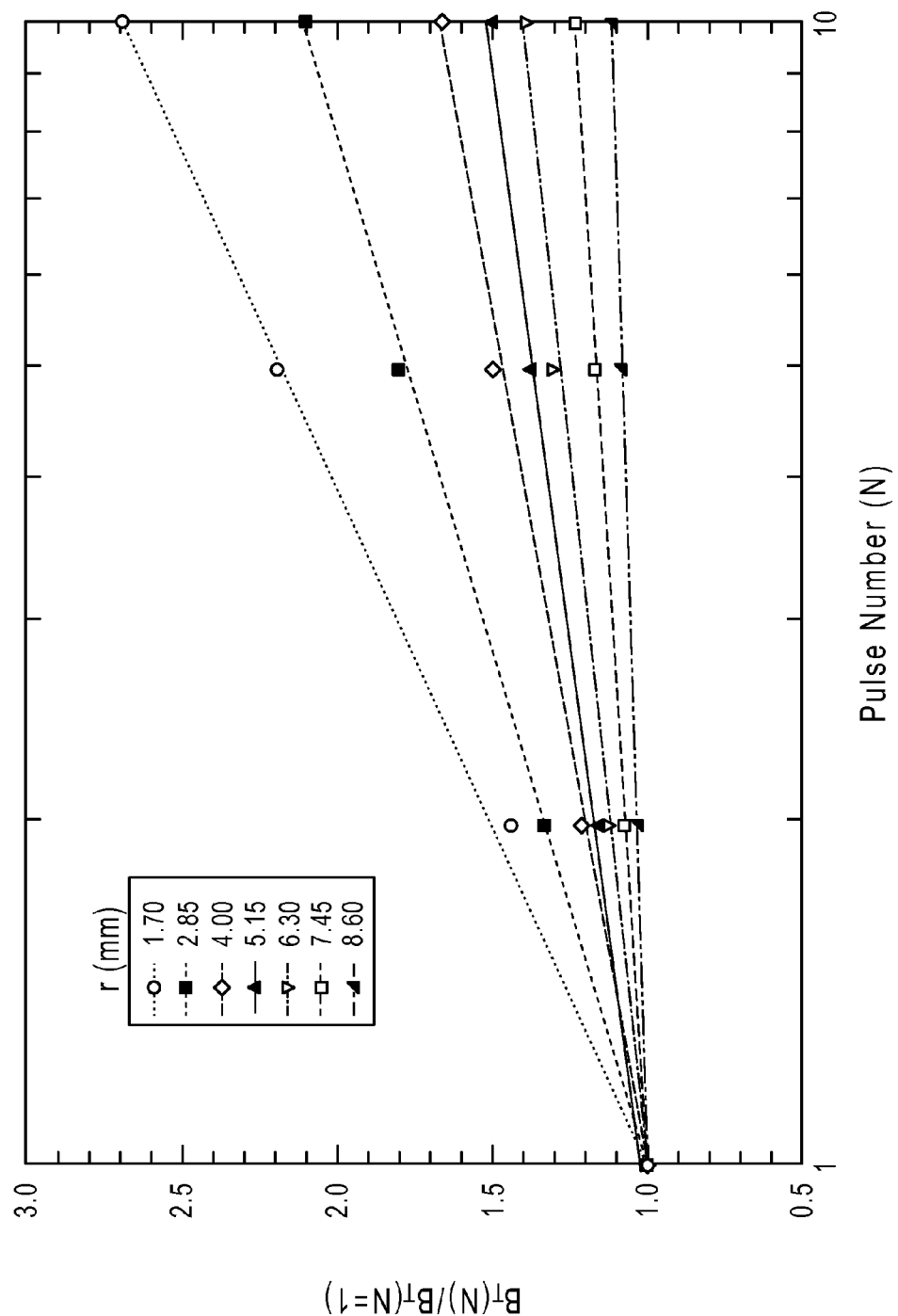

As illustrated in FIGS. 17-20, the data in the present experiment confirmed the log N behavior over a wide range of $I_{EM}$ values. Deviations, however, were also discovered from the log N behavior. One such deviation is illustrated, for example, in FIG. 18, for data at $I_{EM}$=110 A. As shown in FIG. 18, the data for the lowest values of r deviated systematically from log N behavior, with deviations of approximately 15%. In FIG. 19, for data at $I_{EM}$=170 A, the deviations appeared somewhat smaller.

In addition to these small deviations, the log N behavior also was determined to be more substantially limited at a high value of the trapped field ($B_T$). In light of log N in equation (2) growing without limit as N→∞, equation (2) would indicate that $B_T(r)$ grows to an infinite trapped field, as N→∞. However, it has been determined that $B_{T,MAX}$ is physically limited to finite values by finite $J_C$. Thus, a modification to equation (2) was sought, which limits $B_T(r, N→∞)$ to some finite value smaller than or equal to the value of $B_{T,MAX}(r)$ set by $J_C$.

Figure 20:
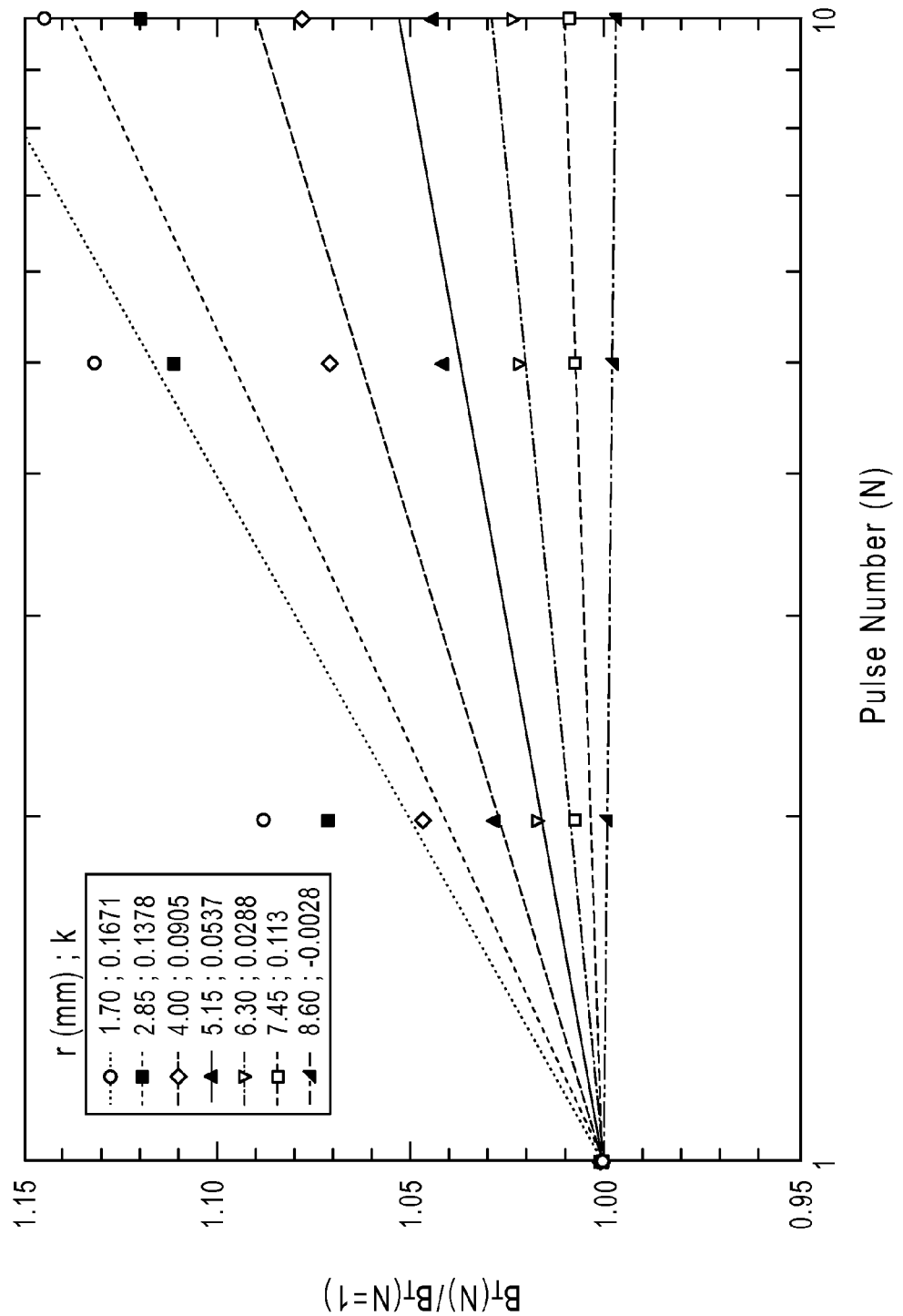

In order to observe the limiting behavior, studies were focused on the high-pulse activation data at, e.g., $I_{EM}$=280 A (see FIG. 20). As illustrated in FIG. 20, as expected, the experimental increases of $B_T(r, N)$, which had been proportional to log N, leveled off and became saturated at higher values of N.

To find a phenomenological equation to accommodate the saturation of $B_T(r, N)$, equation (3) was modified with a multiplicative correction term in which the increase in trapped field, $\Delta B_T(r, N)$, on the Nth pulse approaches zero, as N→∞, and the trapped field, $B_T(r, N)$ approaches whatever its limiting value may be at very large N. This limiting value was designated as $B^*(r, I_{EM})$.

Accordingly, a simple saturation term was considered:

$$\left[1 - \frac{B_T(r, I_{EM}, N-1,)}{B^*(r, I_{EM})}\right]$$

which made the increment in trapped field on the Nth pulse:

$$\Delta B_T(r, N) = \frac{B(r, N=1)k}{N}\left[1 - \frac{B_T(r, I_{EM}, N-1)}{B^*_T(r, I_{EM})}\right] \quad (4)$$

The trapped field, following the $N^{th}$ pulse then be determined by:

$$B_T(r, N) = B_T(r, N=1) \times \left(1 + \sum_2^N \frac{k}{N}\left[1 - \frac{B_T(r, I_{EM}, N-1)}{B^*(r, I_{EM})}\right]\right) \quad (5)$$

Figure 21:
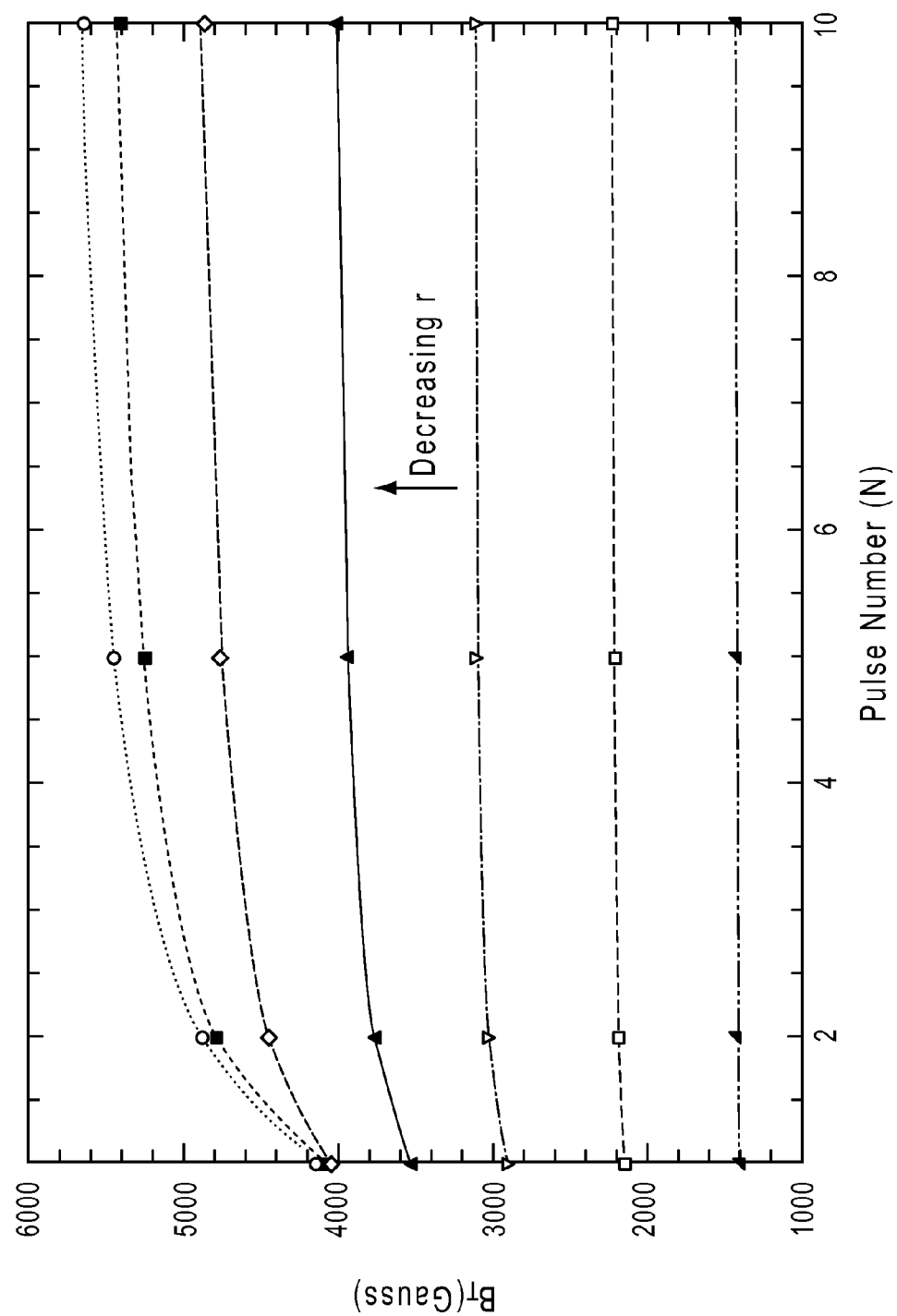
FIG. 21 shows a graph illustrating the trapped magnetic field $B_T$ as a function of pulse number N for experimentally derived values of $B_T(r,N)$ fit by proposed phenomenological theory.

Equation (5) was tested to see if the experimental values of $B_T(r, N)$ fit the data, for some choice of B*. For example, if the data fit the equation, for some value of B*, equation (5) could be further used to quantify $B^*(r, I_{EM})$ and potentially identify the physical nature of the limiting field. In FIG. 21, for example, the curves joining the experimental points resulted from applying equation (5) and finding a best value of $B^*(r, I_{EM})$. The best values of $B^*(r)$, at the given value of $I_{EM}$, are shown in FIG. 21 for each measured value of r. Accordingly, equation (5) provided a very good fit to the experimental data, and it was concluded that the modification of the log N law presented in equation (5) was an applicable phenomenological law that represents the multi-pulse data. The value of trapped field following the first pulse, $B_T(r, N=1)$, however, is not described by equation (5). The values of trapped field following the first pulse can instead be directly obtained from the plots of the trapped field achieved by the first pulse (see FIGS. 12-16).

Figure 22:
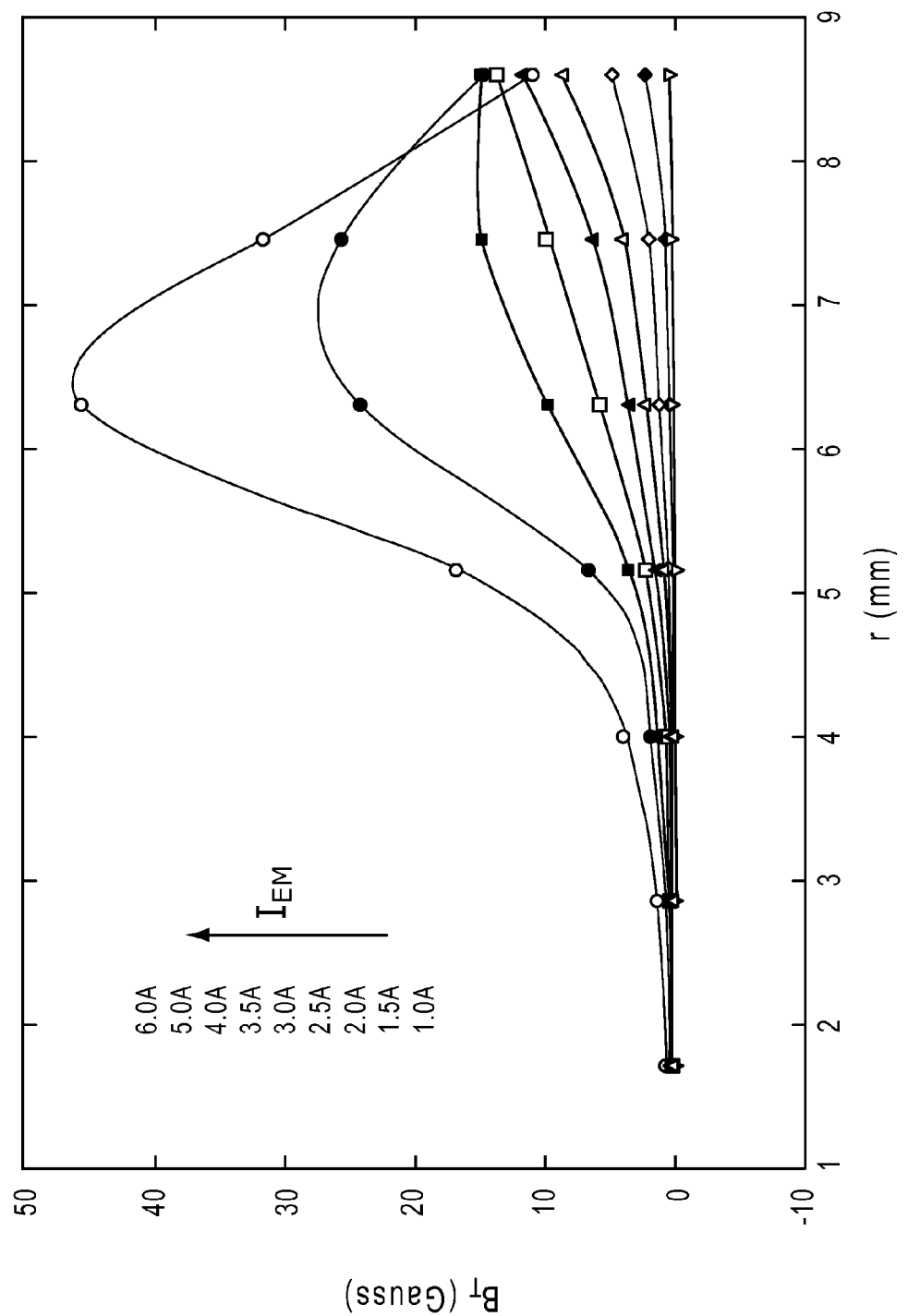
FIG. 22 shows a graph illustrating the trapped magnetic field $B_T$ as a function of radial position r across the TFM in FIG. 11 at various electromagnet currents $I_{EM}$, and showing the decrease of the trapped magnetic field $B_T$ with increased current $I_{EM}$ at large values of r.

The values of $B^*(r)$ also were found to be very sensitive to any type of error in the data, or any anomaly due to varying physical mechanisms in the activation process. Both error types exist in the data reported here. It was noted that there were two regions within the values of $(r, I_{EM})$ in which the fits of equation (5) to the data points were significantly different than could be accounted for by the known experimental errors in measuring values of $B_T(r, N, I_{EM})$. One of these regions was at the lowest values of r, and the other was at the highest values of r. It was determined that the first problematic region (at the lowest values of r) was due to a defect (a chip) in the superconducting disk 102 in the region $0 \le r \le 2$, and that the second problematic region (at the highest values of r) was due to the anomalous activation behavior exhibited at high r proximate the outer periphery of the superconducting disk 102 shown, for example, in FIG. 22.

Figure 23:
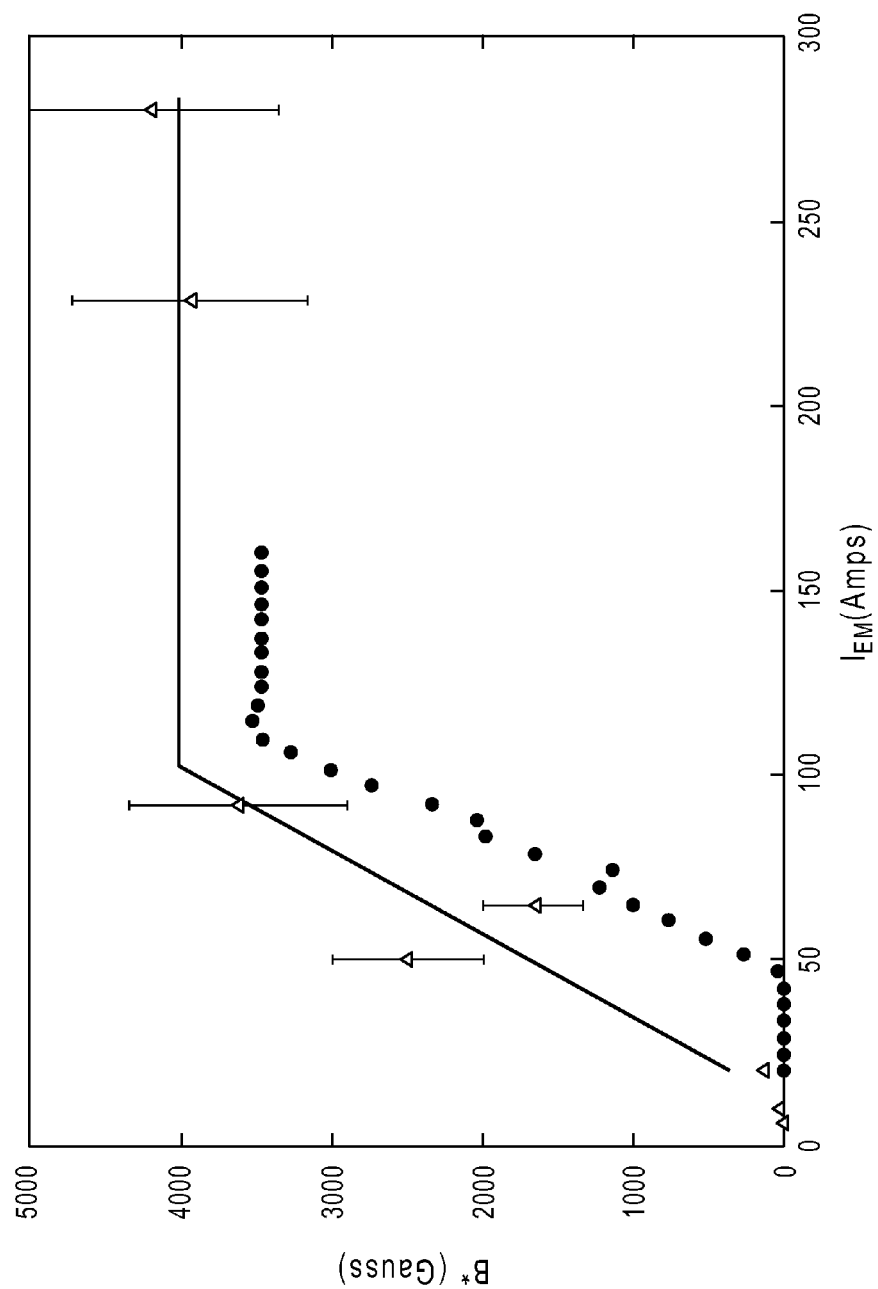
FIG. 23 shows a graph illustrating both the measured and calculated magnetic field B* as a function of electromagnet current $I_{EM}$ at a radial position r of 5.15 mm on the TFM.

The errors (at low r and high r) were sufficiently large enough to impact the ability to make general conclusions concerning $B^*$ in these regions. However, the data at r=5.15 mm, for most values of $I_{EM}$ was between these error prone regions, and permitted a conclusion to be drawn concerning the physical nature of $B^*(r)$. The analysis of $B^*(r=5.15$ mm, $I_{EM})$ is summarized in FIG. 23. If $B^*(r=5.15$ mm, $I_{EM})$ were equivalent to the maximum obtainable field, $B_{T,MAX}(r=5.15$ mm), the data would all fall at the same value of trapped field, independent of $I_{EM}$. Instead it is shown that $B^*$ is essentially zero at low $I_{EM}$, and rises until $I_{EM}$ is approximately 100 A ($B_A$ is approximately 15,000 G), after which it is approximately flat. The behavior, therefore, appears to be that of a zero field cool (ZFC) TFM type of activation in various constant and uniform applied fields.

In order to compare the values of $B^*$ to ZFC activation in a constant magnetic field, finite element calculations were done for activations of the superconducting disk (of the EXAMPLE 2 prototype) in constant magnetic fields, in the same excitation geometry as used in the experiments. The values of constant field in these calculations were determined for each value of $I_{EM}$. The results of these calculations are shown by the plotted points in FIG. 23.

It was therefore concluded from the data and calculations that $B^*(r, I_{EM})$ for pulsed activation is the maximum value of $B_T(r, I_{EM})$ reached by a ZFC activation in a constant field of the same magnitude as the pulsed field.

Accordingly, the above experiments determined that the trapped field increment, due to the Nth magnetic field pulse, increases at a rate no larger than 1/N, and that the rate of increase approaches zero when the trapped field approaches the value obtained in ZFC activation by a constant field of the same magnitude as the pulsed field. In other words, it was determined that sequential small magnetic field pulses (i.e., multiple activation pulses) were not an improvement over a single larger magnetic field pulse when attempting to fully activate a TFM. For example, if the first pulse does not fully activate the TFM, no amount of additional pulses will eventually accomplish full activation (although it may be possible to slightly increase the amount of trapped field via multiple pulses short of reaching full activation). Furthermore, the phenomenological law which was developed in equation (5) governs the use of multiple pulses in a row, such that once two pulses (N=2) are used, one can predict the state of the TFM at any number N of pulses, thus providing the ability to predict the amount of partial activation after N pulses using equation (5).

An exemplary method for activating trapped magnetic field in a superconducting material in accordance with an exemplary embodiment of the present disclosure is set forth in the following description with reference to the embodiment of FIG. 1. At least one magnetic field pulse may be generated proximate a superconducting material element 102, which can, for example, be in the form of a solid superconducting disk or other configuration. In accordance with various embodiments of the present disclosure, a majority, e.g., substantially all, of a magnetic field that is generated by the at least one magnetic field pulse is contained within an area that has smaller physical lateral dimensions than the superconducting material element 102. With reference to the disk shaped embodiment of FIG. 1, for example, substantially all of the magnetic field is within a diameter smaller than a diameter of the superconducting disk 102. Thus, as described in detail above, the at least one pulsed magnetic field is applied in a localized manner to a portion of the superconducting material element 102 the majority of which is within the outer peripheral boundaries of the element 102. In this manner, the at least one magnetic field pulse is sufficient to at least partially activate a trapped magnetic field in the superconducting material element 102. In various exemplary embodiments, the at least one magnetic field pulse is sufficient to fully activate the superconducting material element 102 to a TFM.

In various exemplary embodiments, the superconducting material element 102 may be disposed proximate an electromagnet source, such as, for example, electromagnets 104, 106 (see FIG. 1), and the at least one magnetic field pulse may be generated by the electromagnets 104, 106. In various embodiments, for example, the electromagnets 104, 106 may generate the at least one magnetic field pulse when an electric current (via e.g., a pulse generator 120 and/or a capacitor 130) is run through the electromagnets 104, 106.

In various exemplary embodiments, the electromagnets 104, 106 may generate a single magnetic field pulse, such as, for example, a single magnetic field pulse having a duration ranging from about 10 ms to about 30 ms or longer. In various additional embodiments, the electromagnets 104, 106 may generate a plurality of magnetic field pulses. In various embodiments, for example, a number of magnetic field pulses generated may be selected based on a predicted amount of trapped magnetic field in the superconducting material element 102, such as, for example, based on the above equation (5).

As above, to keep the superconducting material element 102 cold so that the activated TFM does not lose its magnetic field, in various embodiments, the superconducting material element 102 may also be cooled to maintain a temperature sufficient to maintain activation of the superconducting material element 102. In various embodiments, for example, the superconducting material element 102 may be cooled by a cryostat 110, which houses the superconducting material element 102 and the electromagnets 104, 106, or by an enclosed volume of liquid nitrogen maintained at below atmospheric pressure in order to reduce its temperature.

Systems and methods for activating TFMs as disclosed herein have numerous applications, including, for example, magnetic drive devices, such as, for example, magnetic motors, which in accordance with the present disclosure may be used in various industrial applications with which those of ordinary skill in the art are familiar. Such applications may include, but are not limited to, hydraulic pumps, drills, and various additional rotating drive shafts, such as, for example, a top-drive mechanism used in the oil and gas industry. Magnetic motors utilizing the TFM systems described herein may, for example, provide compact yet robust magnetic motors, which provide for onboard, or in situ, activation and/or reactivation of TFMs. Such systems may, for example, be particularly beneficial in operating industrial rotary equipment located in challenging and/or inaccessible environments, such as, for example, on oil rigs, in which size constraints often limit the power output of conventional permanent magnet motors.

Although only a few exemplary embodiments have been described in detail above, those skilled in the art will readily appreciate that many modifications are possible in the example embodiments without materially departing from this disclosure. Accordingly, all such modifications are intended to be included within the scope of this disclosure as defined in the following claims.

It is to be understood that the various embodiments shown and described herein are to be taken as exemplary. Elements and materials, and arrangements of those elements and materials, may be substituted for those illustrated and described herein, and portions may be reversed, all as would be apparent to one skilled in the art after having the benefit of the description herein. Changes may be made in the elements described herein without departing from the spirit and scope of the present disclosure and following claims, including their equivalents.

Those having ordinary skill in the art will recognize that various modifications may be made to the configuration and methodology of the exemplary embodiments disclosed herein without departing from the scope of the present teachings. By way of example only, the cross-sectional shapes and relative sizes of the superconducting material and electromagnets may be modified and a variety of cross-sectional configurations may be utilized, including, for example, circular or oval cross-sectional shapes.

Those having ordinary skill in the art also will appreciate that various features disclosed with respect to one exemplary embodiment herein may be used in combination with other exemplary embodiments with appropriate modifications, even if such combinations are not explicitly disclosed herein.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the written description and claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. As used herein, the term "include" and its grammatical variants are intended to be non-limiting, such that recitation of items in a list is not to the exclusion of other like items that can be substituted or added to the listed items.

It will be apparent to those skilled in the art that various modifications and variations can be made to the systems and methods of the present disclosure without departing from the scope the present disclosure and appended claims. Other embodiments of the disclosure will be apparent to those skilled in the art from consideration of the specification and practice of the disclosure disclosed herein. It is intended that the specification and examples be considered as exemplary only.

What is claimed is:

1. A system for activating trapped field magnets in a superconducting material, the system comprising:
a pair of wire-wound split field electromagnets each with an iron or other ferro-magnetic core; and
a superconducting material element disposed between the pair of electromagnets, the pair of electromagnets and the superconducting material element being aligned in an axial direction and the superconducting material element extending radially beyond the electromagnets,
wherein the electromagnets are configured to produce a magnetic field pulse including a single magnetic field pulse that is sufficient to fully activate the superconducting material element.

2. The system of claim 1, wherein the superconducting material is a high temperature superconducting material.

3. The system of claim 2, wherein the high temperature superconducting material is yttrium barium copper oxide.

4. The system of claim 1, wherein the superconducting material element is disk shaped.

5. The system of claim 4, wherein a lateral dimension of the superconducting material element is greater than a lateral dimension of each of the electromagnets.

6. The system of claim 1, wherein the single magnetic field pulse has a duration ranging from about 10 milliseconds to about 30 milliseconds.

7. The system of claim 1, wherein the superconducting material element is maintained within a temperature range sufficient to maintain activation of the superconducting material element.

8. The system of claim 7, wherein the superconducting material and the pair of electromagnets are disposed within a cryostat.

9. The system of claim 8, wherein the cryostat is a closed system operated at below atmospheric pressure.

10. The system of claim 7, wherein the superconducting material element is maintained within the temperature range by an evaporated cold gas of a low temperature liquid.

11. The system of claim 1, wherein the pair of electromagnets are positioned such that a central portion of each electromagnet is axially aligned with a central portion of the superconducting material element.

12. The system of claim 1, wherein the single magnetic field pulse has a duration of at least about 10 milliseconds or greater.

13. A method for activating a trapped magnetic field in a superconducting material, the method comprising:
generating a single magnetic field pulse using a pair of wire-wound split field electromagnets, each having an iron or other ferro-magnetic core, wherein a superconducting material element is disposed between the electromagnets and is aligned in an axial direction with the electromagnets, the superconducting material element extending radially beyond the electromagnets; and activating the superconducting material element to a fully activated trapped field magnet using the single magnetic field pulse.

14. The method of claim 13, wherein generating the single magnetic field pulse comprises generating the magnetic field pulse for a duration ranging from about 10 milliseconds to about 30 milliseconds.

15. The method of claim 13, further comprising cooling the superconducting material element to a temperature sufficient to maintain activation of the superconducting material element.

16. The method of claim 13, wherein the pair of electromagnets are positioned such that a central portion of each electromagnet is axially aligned with a central portion of the superconducting material element.

17. The method of claim 13, wherein generating the single magnetic field pulse comprises generating the magnetic field pulse for a duration of about 10 milliseconds or greater.

18. A method for activating a trapped magnetic field in a superconducting material element, the method comprising:
generating a plurality of magnetic field pulses using a pair of wire-wound split field electromagnets, each having an iron or other ferro-magnetic core, wherein a superconducting material element is disposed between the electromagnets and is aligned in an axial direction with the electromagnets, the superconducting material element extending radially beyond the electromagnets; and
activating the superconducting material element to a trapped field magnet using the plurality of magnetic field pulses,
wherein a number of the plurality of magnetic field pulses generated is chosen based on $$B_T(r, N) = B_T(r, N = 1) \times \left(1 + \sum_{2}^{N} \frac{k}{N}\left[1 - \frac{B_T(r, I_{EM}, N-1)}{B^*(r, I_{EM})}\right]\right),$$

wherein $B_T$ is the trapped magnet field in the superconducting material element, r is a radial position across the superconducting material element, N is the number of the plurality of magnetic field pulses, $I_{EM}$ is an electromagnetic current, $B^*$ is a maximum value of $B_T$ and k is a value determined by $$k = N\left(\frac{\Delta(B_T[r, N])}{B_T[r, N = 1]}\right).$$

19. The method of claim 18, further comprising cooling the superconducting material element to a temperature sufficient to maintain activation of the superconducting material element.

20. The method of claim 18, wherein k is $0.022 \leq k \leq 1.906$.

* * * * *